United States Patent
Fujimori

(10) Patent No.: US 10,562,658 B2
(45) Date of Patent: Feb. 18, 2020

(54) MAGNETIC SHIELD TRAY, MAGNETIC SHIELD WRAPPER AND MAGNETIC MEMORY PRODUCT SHIELDED FROM EXTERNAL MAGNETIC FIELD

(71) Applicant: TOSHIBA MEMORY CORPORATION, Minato-ku, Tokyo (JP)

(72) Inventor: Takeshi Fujimori, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/829,367

(22) Filed: Dec. 1, 2017

(65) Prior Publication Data

US 2018/0079547 A1    Mar. 22, 2018

Related U.S. Application Data

(63) Continuation of application No. PCT/IB2016/051436, filed on Mar. 14, 2016.
(Continued)

(51) Int. Cl.
| | |
|---|---|
| *B65D 1/36* | (2006.01) |
| *B65D 5/50* | (2006.01) |
| *B65D 81/38* | (2006.01) |
| *H01L 21/673* | (2006.01) |
| *H01L 23/552* | (2006.01) |
| *H01L 43/02* | (2006.01) |
| *H01L 27/22* | (2006.01) |
| *H01L 43/08* | (2006.01) |

(52) U.S. Cl.
CPC ............... *B65D 1/36* (2013.01); *B65D 5/503* (2013.01); *B65D 81/3813* (2013.01); *H01L 21/67336* (2013.01); *H01L 23/552* (2013.01); *H01L 43/02* (2013.01); *B65D 2213/02* (2013.01); *B65D 2585/86* (2013.01); *H01L 27/228* (2013.01); *H01L 43/08* (2013.01)

(58) Field of Classification Search
None
See application file for complete search history.

(56) References Cited

U.S. PATENT DOCUMENTS

| | | | |
|---|---|---|---|
| 7,020,004 B1 * | 3/2006 | Hurst | ............ G11C 11/15 257/E27.005 |
| 7,344,896 B2 * | 3/2008 | Leuschner | ............ G11C 11/16 257/295 |

(Continued)

FOREIGN PATENT DOCUMENTS

| | | |
|---|---|---|
| JP | 04026389 Y2 | 6/1992 |
| JP | 2001294246 A | 10/2001 |

(Continued)

OTHER PUBLICATIONS

International Search Report (ISR) and Written Opinion dated Jun. 7, 2016 issued in International Application No. PCT/IB2016/051436.

*Primary Examiner* — Xanthia C Cunningham
(74) *Attorney, Agent, or Firm* — Holtz, Holtz & Volek PC

(57) ABSTRACT

According to an embodiment, a magnetic shield tray includes a main body with a plate form including a magnetic material, and mount portions as holes disposed in the main body. The magnetic material is exposed on an inner surface of the holes.

17 Claims, 20 Drawing Sheets

Related U.S. Application Data

(60) Provisional application No. 62/203,641, filed on Aug. 11, 2015.

(56) References Cited

U.S. PATENT DOCUMENTS

| | | | | |
|---|---|---|---|---|
| 7,545,662 B2* | 6/2009 | Wang | ............ | G11C 5/025 |
| | | | | 257/659 |
| 7,615,996 B1* | 11/2009 | Machita | ............ | B82Y 25/00 |
| | | | | 324/252 |
| 7,907,422 B2 | 3/2011 | Tokuyama | | |
| 8,854,870 B2* | 10/2014 | Katti | ............ | H01L 43/12 |
| | | | | 365/158 |
| 2004/0032010 A1* | 2/2004 | Kools | ............ | H01L 27/222 |
| | | | | 257/659 |
| 2008/0122047 A1* | 5/2008 | Honer | ............ | H01L 23/552 |
| | | | | 257/660 |
| 2010/0214835 A1* | 8/2010 | Ding | ............ | B82Y 25/00 |
| | | | | 365/173 |
| 2011/0182025 A1 | 7/2011 | Abrahamson | | |
| 2014/0225208 A1* | 8/2014 | Gu | ............ | H01L 43/02 |
| | | | | 257/422 |
| 2015/0084141 A1* | 3/2015 | Fujimori | ............ | H01L 23/552 |
| | | | | 257/421 |
| 2015/0091109 A1* | 4/2015 | Allinger | ............ | H01L 23/552 |
| | | | | 257/421 |

FOREIGN PATENT DOCUMENTS

| | | |
|---|---|---|
| JP | 2004188215 A | 7/2004 |
| JP | 2008264261 A | 11/2008 |

\* cited by examiner

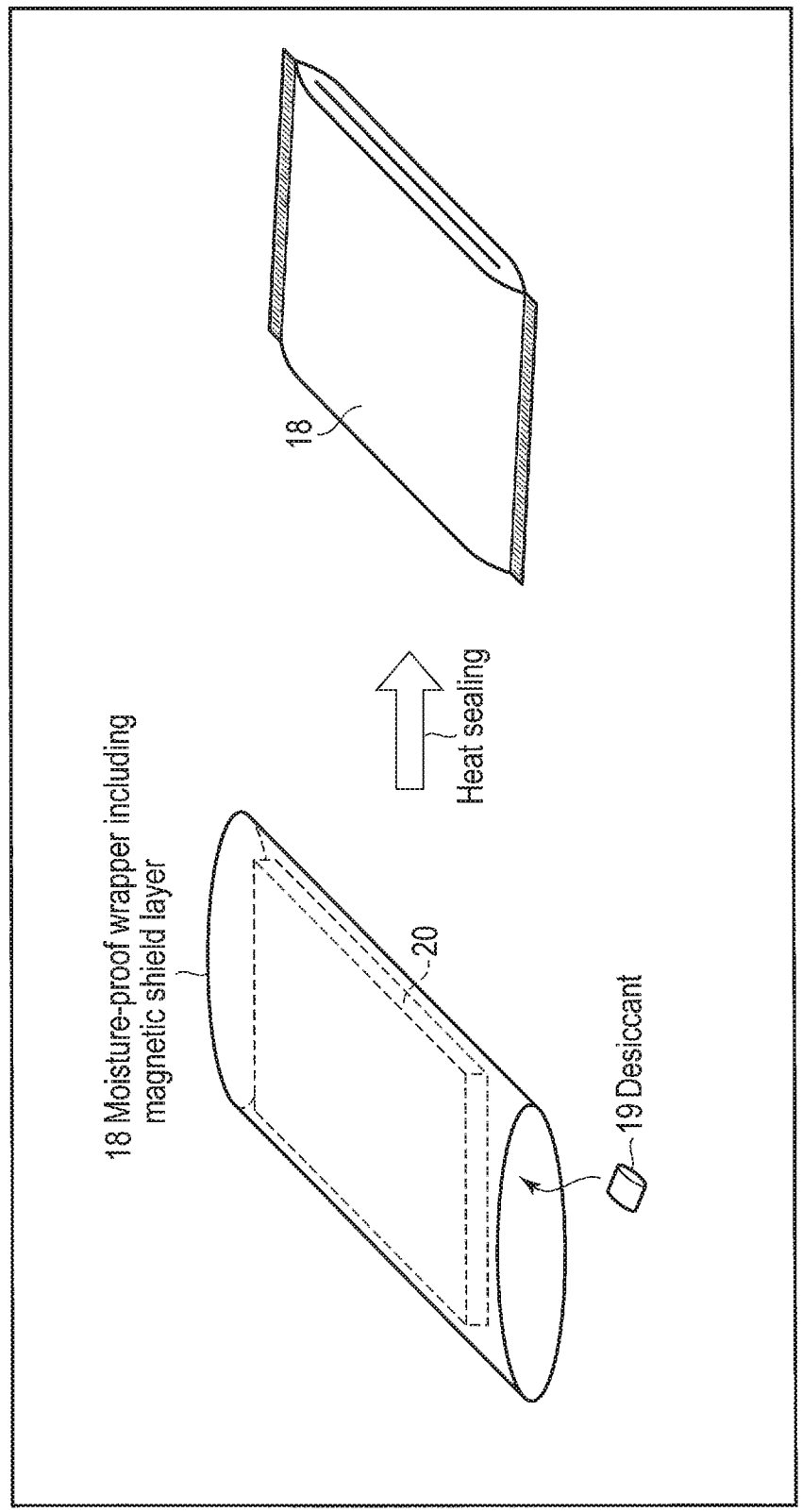
F I G. 18

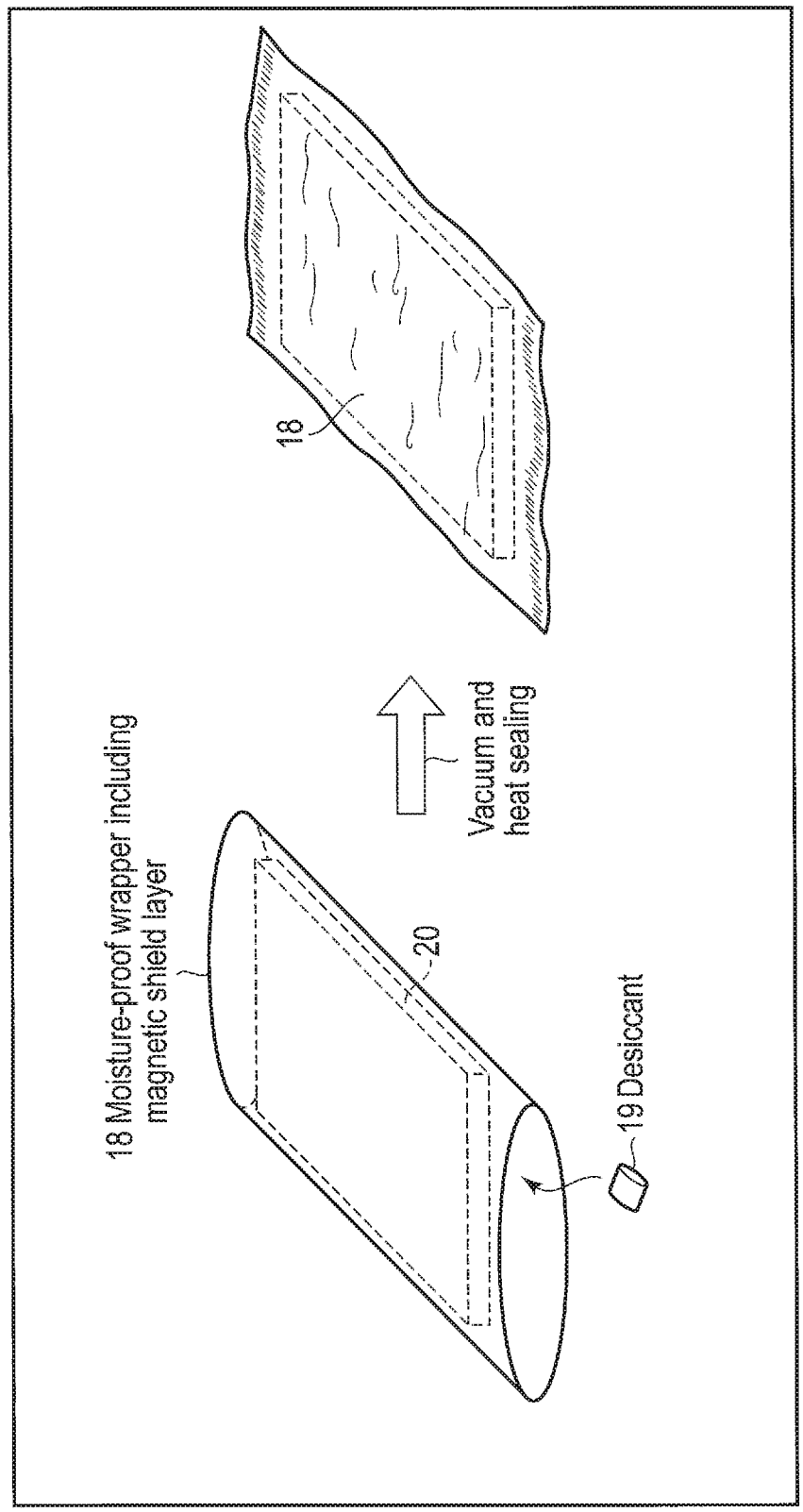
F I G. 20

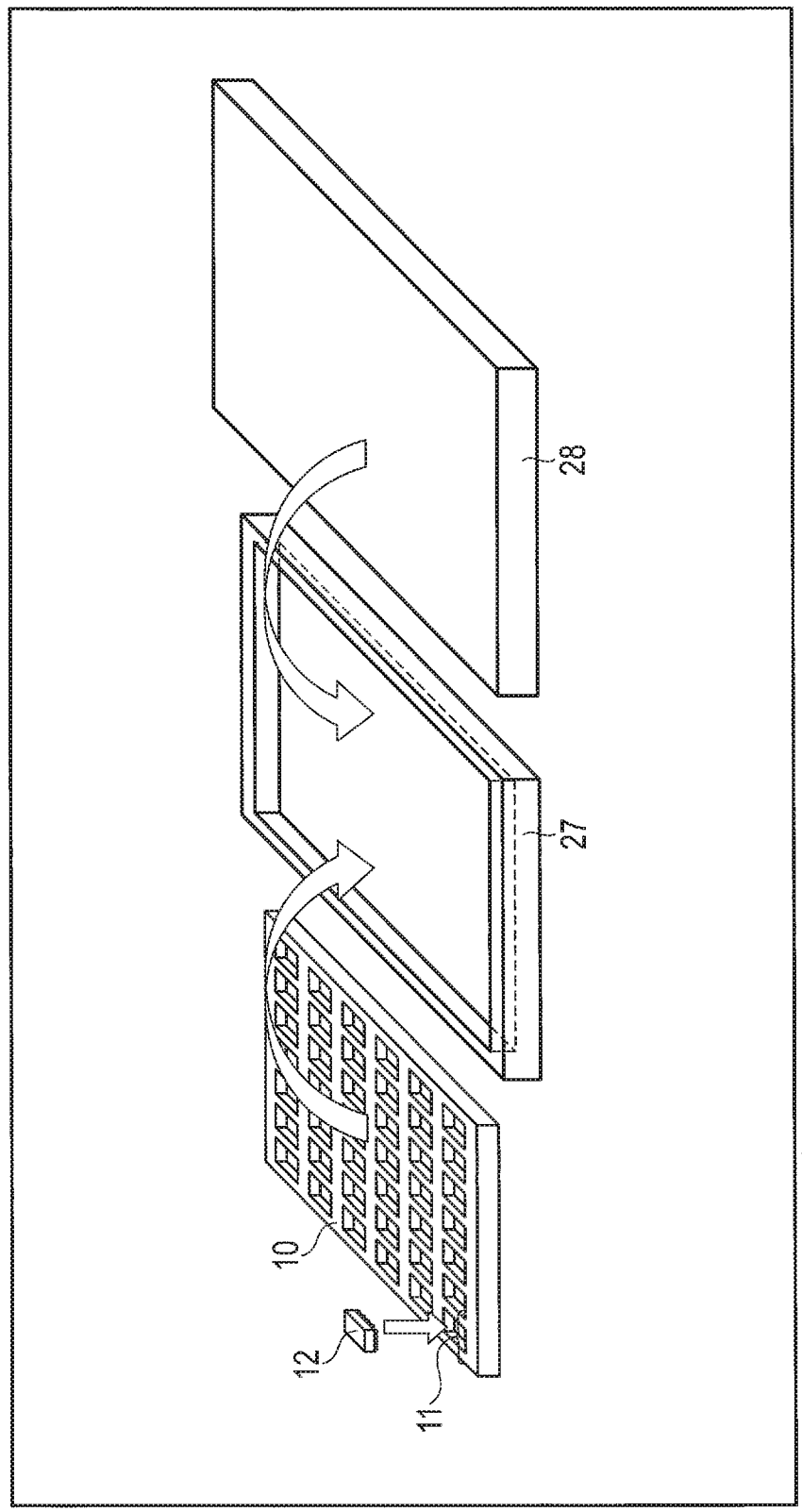
F I G. 23

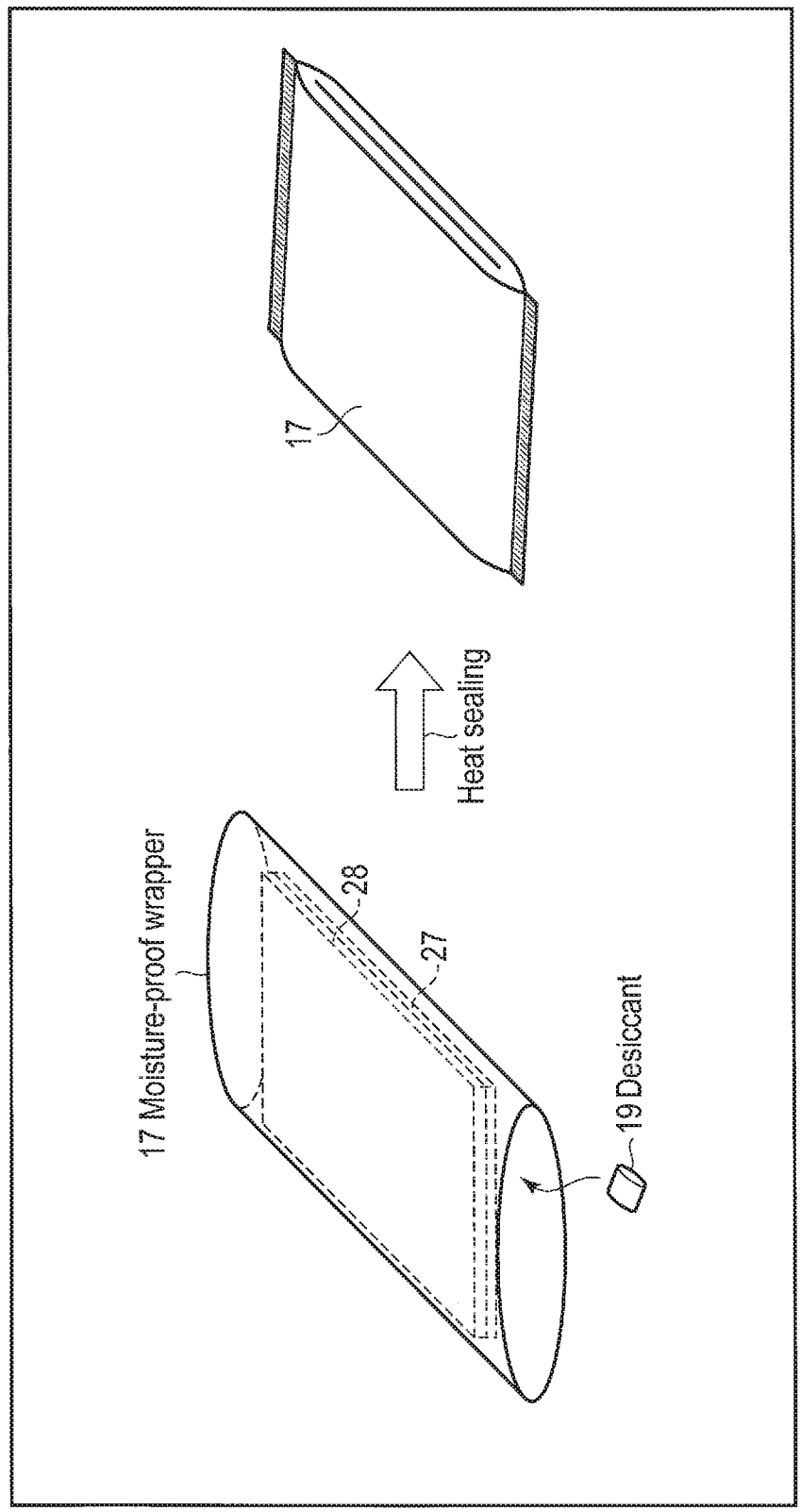
F I G. 31

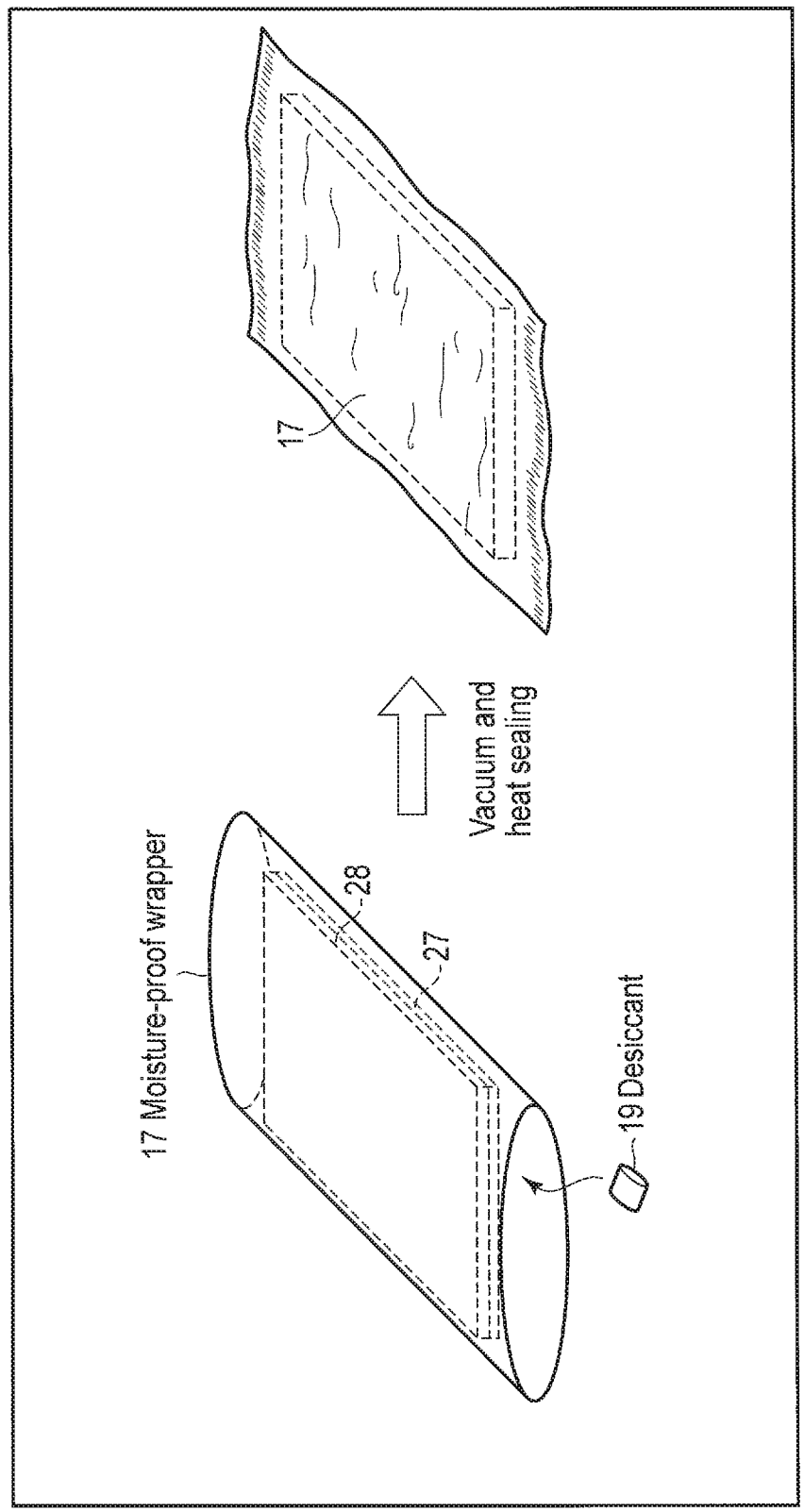
F I G. 32

MAGNETIC SHIELD TRAY, MAGNETIC SHIELD WRAPPER AND MAGNETIC MEMORY PRODUCT SHIELDED FROM EXTERNAL MAGNETIC FIELD

CROSS-REFERENCE TO RELATED APPLICATIONS

This application is a Continuation Application of PCT Application No. PCT/IB2016/051436, field Mar. 14, 2016 and based upon and claiming the benefit of priority from U.S. Provisional Application No. 62/203,641, filed Aug. 11, 2015, the entire contents of all of which are incorporated herein by reference.

FIELD

Embodiments described herein relate generally to a magnetic shield tray, a magnetic shield wrapper and a magnetic memory product shielded from an external magnetic field.

BACKGROUND

Magnetic memories such as magnetic random access memories (MRAMs) store data by using magnetism. Therefore, even in a product shipped as a conforming item, if it is subjected to an external magnetic field while being transported, cases occur in which data saved in the product is damaged and normal operation is disabled.

BRIEF DESCRIPTION OF THE DRAWINGS

FIG. 17 to FIG. 20 are perspective views showing a magnetic memory product according to a second embodiment.
FIG. 23 and FIG. 24 are perspective views showing a magnetic memory product according to a third embodiment.
FIG. 31 and FIG. 32 are perspective views showing a magnetic memory product according to a fourth embodiment.

DETAILED DESCRIPTION

In general, according to an embodiment, a magnetic shield tray comprises: a main body with a plate form including a magnetic material; and mount portions as holes disposed in the main body, wherein the magnetic material is exposed on an inner surface of the holes.

EMBODIMENTS

Embodiments described hereinafter relate to a magnetic shielding technique of, in magnetic memories such as MRAMs, shielding the magnetic memories from an external magnetic field from shipment to implementation.

To shield magnetic memories from an external magnetic field, it suffices if the magnetic memories are surrounded by a magnetic shielding layer (magnetic layer). However, the magnetic memories have characteristic properties of being small, vulnerable to static electricity, etc. In addition, shipment is carried out, for example, with the magnetic memories mounted in one tray. Moreover, a magnetic shielding structure which increases a manufacturing cost cannot be adopted.

Accordingly, to surround magnetic memories by a magnetic shielding layer, it is necessary to give consideration based on the structure of a magnetic memory product at the time of shipment.

Hereinafter, a structure example of a magnetic memory product in which magnetic memories can be effectively shielded from an external magnetic field without an increase in manufacturing cost will be described.

Tray

First, an example of a tray in which magnetic memories are mounted will be described.

Figure 1:
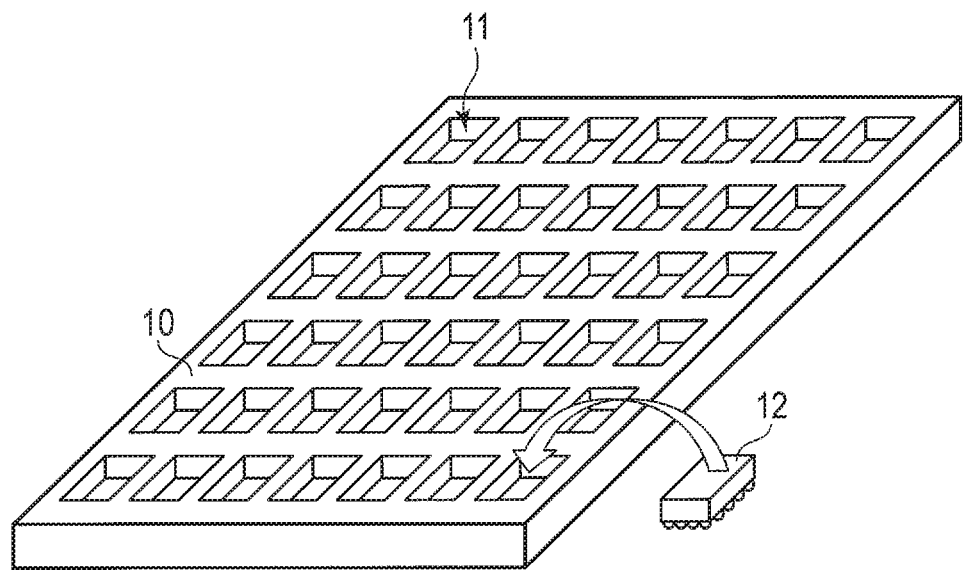
FIG. 1 is a perspective view showing an example of a tray in which magnetic memories are mounted.
Figure 2:
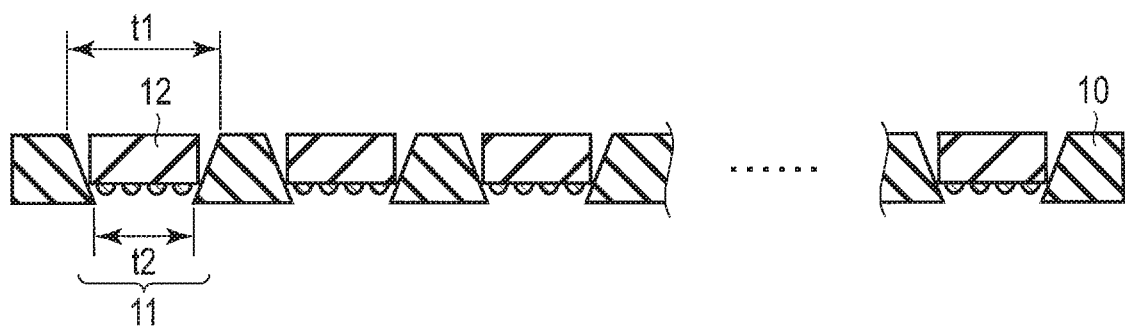
FIG. 2 and FIG. 3 are cross-sectional views of the tray of FIG. 1.
Figure 3:
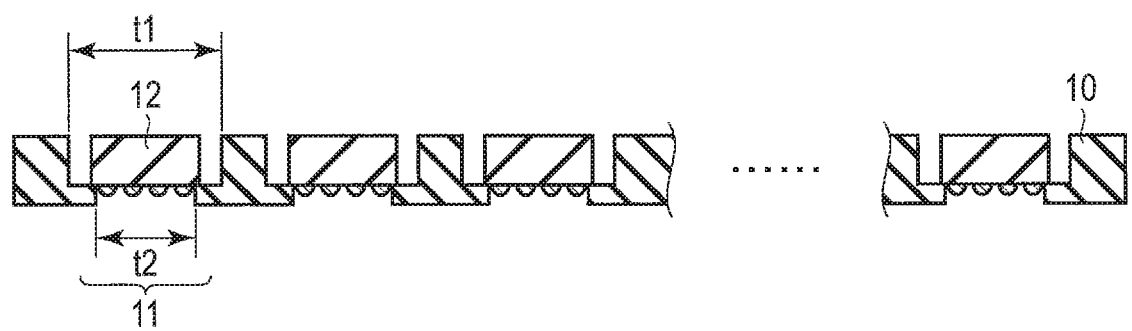

FIG. 1 shows the example of the tray in which the magnetic memories are mounted. FIG. 2 and FIG. 3 are cross-sectional views of the tray of FIG. 1.

A tray 10 comprises a main body with a plate form. The main body comprises a resin, for example, polystyrene (PS), acrylonitrile butadiene styrene (ABS), polyphenyleneether (PPE), and polyphenylenesulfide (PPS). In addition, the tray 10 comprises mount portions 11 disposed in an array. Magnetic memories 12 are mounted in the mount portions 11, respectively.

Figure 4:
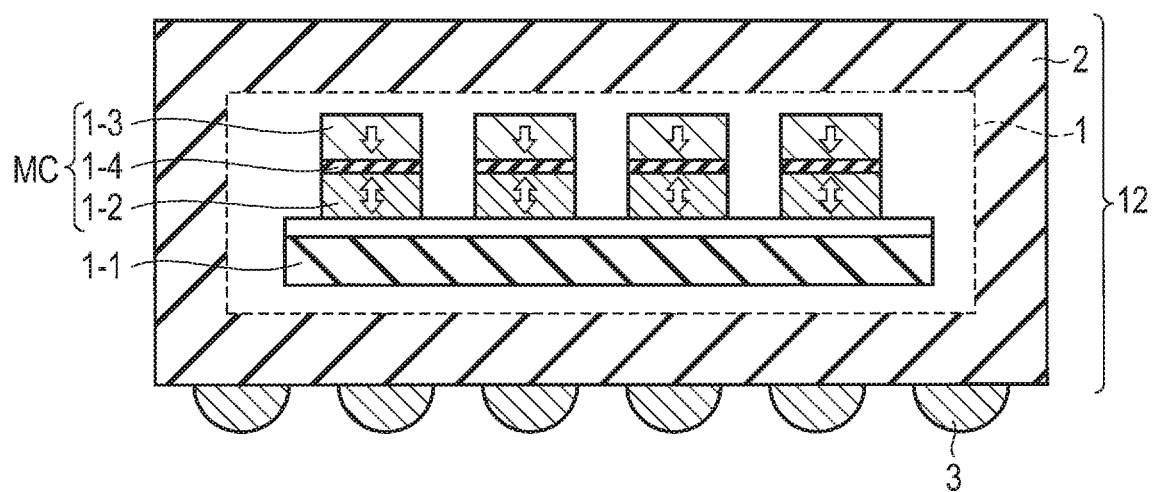
FIG. 4 is a cross-sectional view showing an example of the magnetic memories.

Each of the magnetic memories 12 is, for example, a packaged LSI. For example, as shown in FIG. 4, the magnetic memories 12 comprise a magnetic memory chip 1, a package (a resin, etc.) 2 covering the magnetic memory chip 1, and contacts (a ball-grid array, etc.) 3 attached to the package 2.

Here, the mount portions 11 are holes disposed in the main body of the tray 10, respectively. These holes pass through the main body. If we denote the width of each of the magnetic memories 12 as tchip, each of the mount portions (each of the holes) 11 has an opening width t1 greater than tchip and an opening width t2 less than tchip.

Therefore, when the magnetic memories 12 are mounted in the mount portions 11 from the opening width t1 side, the magnetic memories 12 are held in the mount portions 11.

It should be noted that in the structure of the mount portions 11, the opening widths may vary continuously from t1 to t2 as shown in FIG. 2, or the opening widths may vary discontinuously from t1 to t2 as shown in FIG. 3. In addition, although the mount portions 11 are bottomless holes, they may be holes with bottoms instead.

First Embodiment

Figure 5:
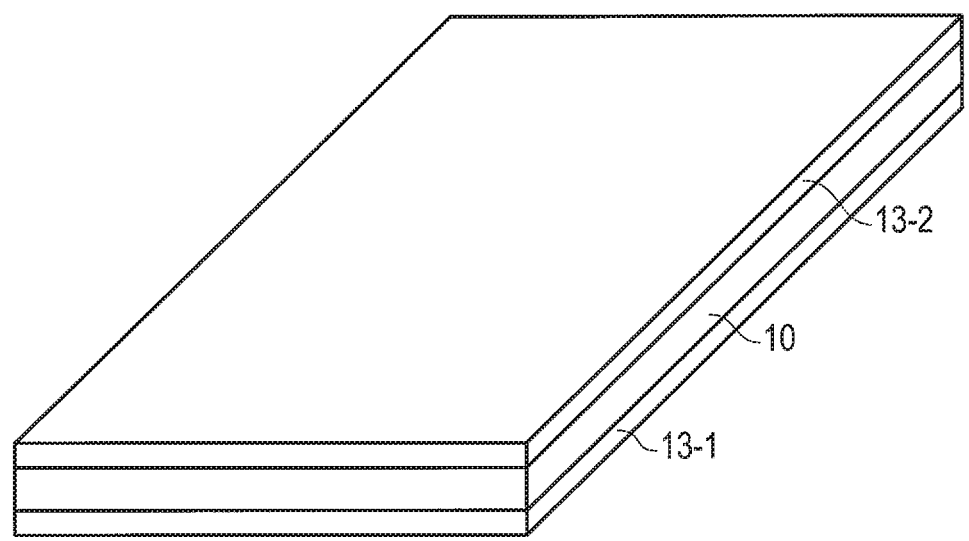
FIG. 5 is a perspective view showing a magnetic memory product according to a first embodiment.

FIG. 5 shows a magnetic memory product according to a first embodiment. FIG. 6A, FIG. 6B, FIG. 7A, and FIG. 7B are cross-sections of the magnetic memory product of FIG. 5.

This magnetic memory product comprises a tray 10 in which magnetic memories 12 can be mounted, and two magnetic layers 13-1 and 13-2 sandwiching the tray 10.

Figure 6A:
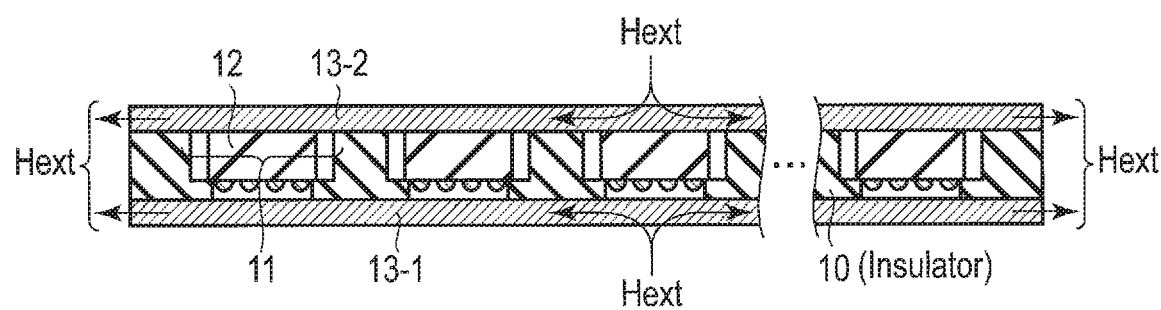
FIG. 6A, FIG. 6B, FIG. 7A, and FIG. 7B are cross-sectional views of the magnetic memory product of FIG. 5.
Figure 6B:
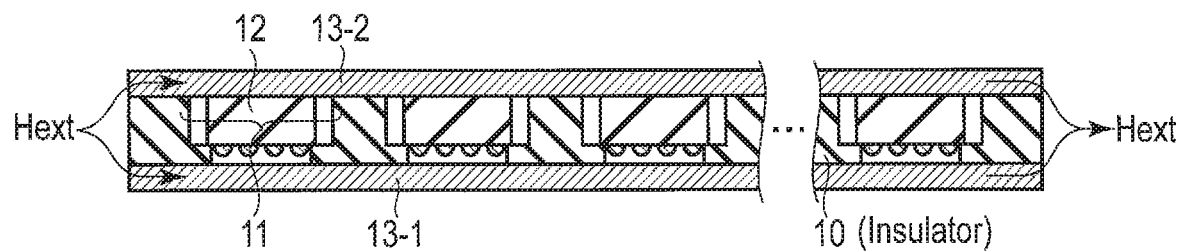

The tray 10 comprises, for example, a main body with a plate form and mount portions 11 as shown in FIG. 6A, FIG. 6B, FIG. 7A, and FIG. 7B. The tray 10 shown in FIG. 6A and FIG. 6B is the same as the tray 10 described with reference to FIG. 1 to FIG. 3.

Figure 7A:
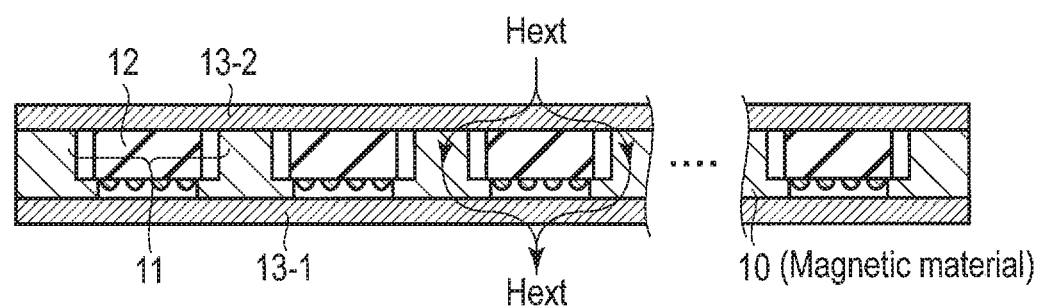
Figure 7B:
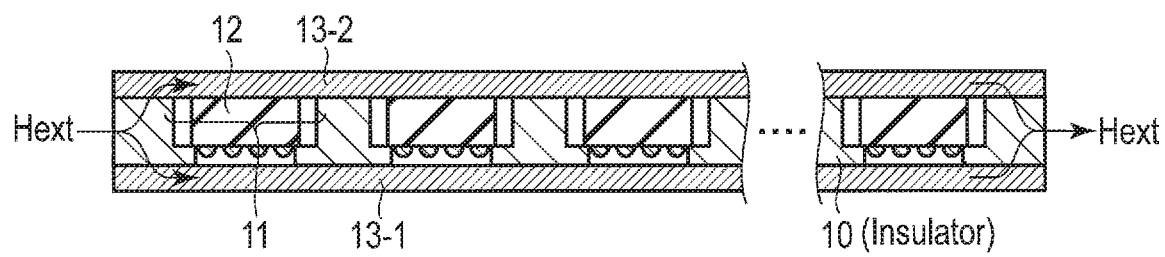

In addition, the tray 10 may have, for example, the structure shown in FIG. 7A and FIG. 7B. FIG. 7A and FIG. 7B differ from FIG. 6A and FIG. 6B in that the tray 10 comprises a magnetic material.

In FIG. 7A and FIG. 7B, all the main body of the tray 10 may be a magnetic material, or only a surface of the main body of the tray 10 may be a magnetic material. In the latter case, the main body of the tray 10 is a resin such as PS, ABS, PPE, and PPS, and its surface is coated with a magnetic material.

The two magnetic layers 13-1 and 13-2 cover two main surfaces of the tray 10, the mount portions (holes) 11 of which are exposed, thereby functioning as magnetic shielding layers shielding the magnetic memories 12 from an external magnetic field Hext.

For example, in the structure of FIG. 6A and FIG. 6B, external magnetic fields Hext from the two main surfaces of the tray 10 are emitted from side surfaces of the tray 10 through the two magnetic layers 13-1 and 13-2. Thus, the external magnetic fields Hext do not exert a bad influence on the magnetic memories 12.

In addition, the area of the side surfaces of the tray 10 is sufficiently small as compared to the area of the main surfaces of the tray 10. Accordingly, external magnetic fields Hext from the side surfaces of the tray 10 are limited and pass through mainly the two magnetic layers 13-1 and 13-2, and thus avoid the magnetic memories 12 and are emitted again from the side surfaces of the tray 10.

Moreover, for example, in the structure of FIG. 7A and FIG. 7B, external magnetic fields Hext from the two main surfaces of the tray 10 pass through the two magnetic layers 13-1 and 13-2 and the tray 10, and are emitted again from the main surfaces of the tray 10. Thus, the external magnetic fields Hext do not exert a bad influence on the magnetic memories 12.

In addition, external magnetic fields Hext from the side surfaces of the tray 10 also pass through the tray 10 and the two magnetic layers 13-1 and 13-2, and are emitted again from the side surfaces of the tray 10. Thus, the external magnetic fields Hext do not exert a bad influence on the magnetic memories 12.

The shielding structure of FIG. 6A and FIG. 6B is called an open loop, because the magnetic memories 12 are not completely surrounded by a magnetic material (an open space exists). On the other hand, the shielding structure of FIG. 7A and FIG. 7B is called a closed loop, because the magnetic memories 12 are completely surrounded by a magnetic material.

From the aspect of a magnetic shielding effect, the shielding structure of the closed loop excels the shielding structure of the open loop. However, the shielding structure of FIG. 6A and FIG. 6B may be sufficient depending on, for example, the kind of the magnetic memories 12 to be shielded.

For example, as shown in FIG. 4, when the magnetic memories 12 comprise perpendicular magnetization type memory cells MC, the magnetic memories 12 are most likely to be influenced by external magnetic fields Hext from the main surfaces of the tray 10. Thus, the shielding structure of FIG. 6A and FIG. 6B effectively shielding them is sufficient.

Here, being perpendicular means being perpendicular to the main surfaces of a semiconductor substrate 1-1 in the magnetic memory chip 1.

For example, in FIG. 4, the memory cells MC comprise a storage layer (magnetic layer) 1-2 having perpendicular and variable magnetization, a reference layer (magnetic layer) 1-3 having perpendicular and invariable magnetization, and a tunnel barrier layer (nonmagnetic insulating layer) 1-4 between the storage layer 1-2 and the reference layer 1-3.

The variable magnetization means that the direction of magnetization can vary in reverse before or after writing, and the invariable magnetization means that the direction of magnetization does not vary before or after writing. The writing means spin transfer writing in which a spin implantation current (spin-polarized electron) is passed to the memory cells MC, whereby a spin torque is imparted to the magnetization of the storage layer 1-2.

Although FIG. 4 shows a top-pin type in which the reference layer 1-3 is disposed above the storage layer 1-2, this can be replaced with a bottom-pin type in which the reference layer 1-3 is disposed below the storage layer 1-2. In addition, the magnetization of the reference layer 1-3 is directed to the storage layer 1-2 side, but may be directed to the opposite side to the storage layer 1-2 instead.

In view of the above, it is sufficient to determine whether to adopt the shielding structure of FIG. 6A and FIG. 6B or the shielding structure of FIG. 7A and FIG. 7B, in consideration of the kind of magnetic memories, a manufacturing cost, etc.

Next, a material example will be described.

It is preferable that the two magnetic layers 13-1 and 13-2 comprise a material having high magnetic permeability and high saturation magnetization. For example, it is preferable that the two magnetic layers 13-1 and 13-2 include Ni, Fe, Co, an alloy of Ni—Fe, an alloy of Fe—Co, $Fe_2O_4$, etc. In addition, if the two magnetic layers 13-1 and 13-2 include $Fe_2O_4$, $Fe_2O_4$ may also include Mn, Zn, Ni, etc. As the two magnetic layers 13-1 and 13-2, a 42 alloy, a permalloy, etc., can be used.

The two magnetic layers 13-1 and 13-2 may comprise the same materials or may comprise materials differing from each other.

In addition, the thicknesses of the two magnetic layers 13-1 and 13-2 may be the same or may differ from each other. The thickness of each of the magnetic layers 13-1 and 13-2 may be less than, may be the same as, or may be greater than the thickness of the tray 10. However, in consideration of the size, the cost, etc., of the magnetic memory product, it is preferable that the thickness of each of the magnetic layers 13-1 and 13-2 be less than the thickness of the tray 10.

It should be noted that the thickness means a thickness in a direction in which the tray 10 and the two magnetic layers 13-1 and 13-2 are stacked.

In addition, the tray 10 and the two magnetic layers 13-1 and 13-2 may be firmly coupled by a coupling component such as a band. Moreover, an interfacial area between the tray 10 and the two magnetic layers 13-1 and 13-2 may include an adhesive sheet.

As described above, according to the first embodiment, the magnetic memories 12 can be effectively shielded from an external magnetic field Hext at low cost simply by adding the two magnetic layers 13-1 and 13-2 with a plate form in consideration of the shape of the tray 10.

Accordingly, the reliability of magnetic memories can be secured from shipment to implementation.

First Modification of First Embodiment

Figure 8:
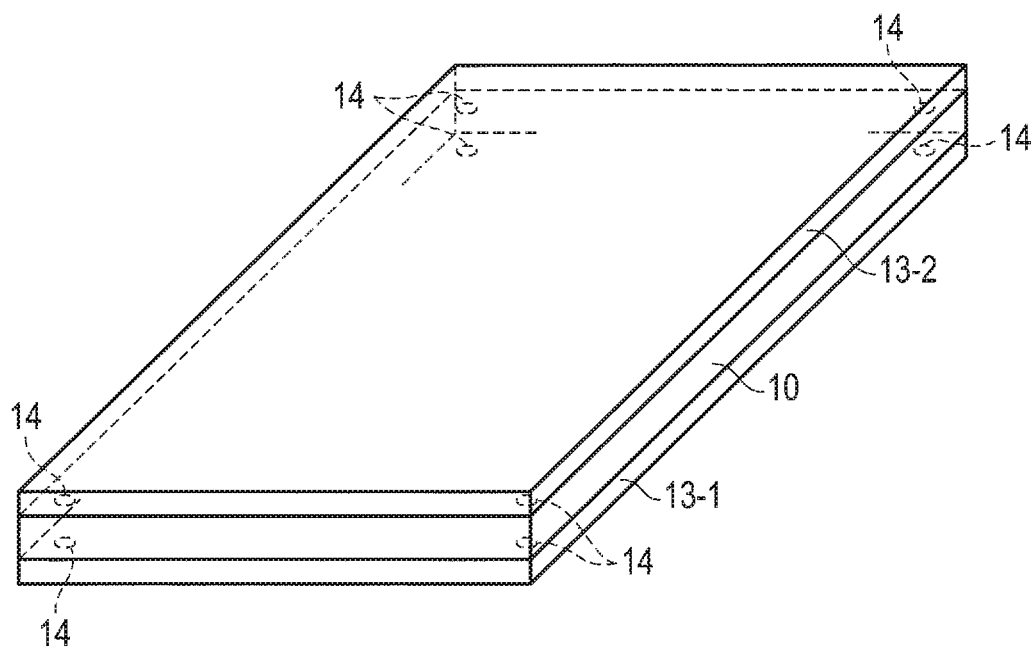
FIG. 8 is a perspective view showing a magnetic memory product according to a first modification of the first embodiment.
Figure 9:
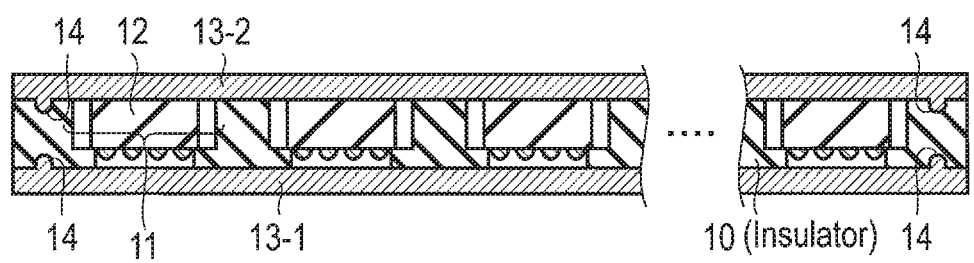
FIG. 9 and FIG. 10 are cross-sectional views of the magnetic memory product of FIG. 8.
Figure 10:
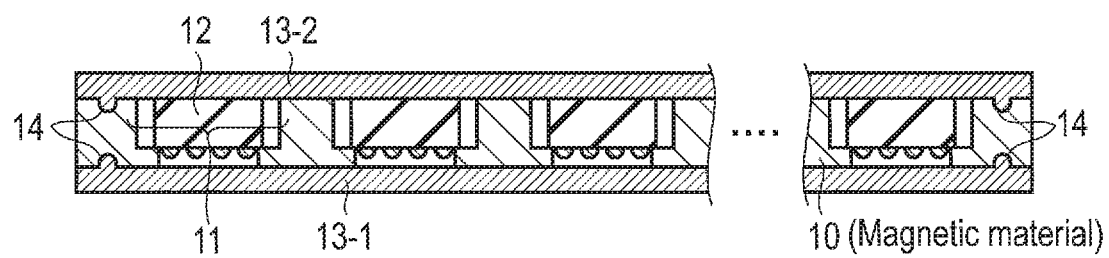

FIG. 8 shows a magnetic memory product according to a first modification of the first embodiment. FIG. 9 and FIG. 10 are cross-sections of the magnetic memory product of FIG. 8.

The first modification relates to a technique of surely aligning a tray 10 and two magnetic layers 13-1 and 13-2 in the first embodiment.

The two magnetic layers 13-1 and 13-2 comprise convex portions 14 for alignment, and the tray 10 comprises concave portions for alignment. The convex portions 14 of the two magnetic layers 13-1 and 13-2 are fitted into the concave portions of the tray 10, whereby these can be accurately aligned. However, the convex portions 14 may be provided on the tray 10, while the concave portions into which the convex portions are fitted are provided on the two magnetic layers 13-1 and 13-2.

In order that the positional relationship between the tray 10 and the two magnetic layers 13-1 and 13-2 will not vary all the time, they may be fixed by a band, an adhesive sheet, etc.

The other points are the same as in the first embodiment. Accordingly, the same elements as those explained in the first embodiment are given the same numbers, and thus, a detailed explanation thereof is omitted.

Second Modification of First Embodiment

Figure 11:
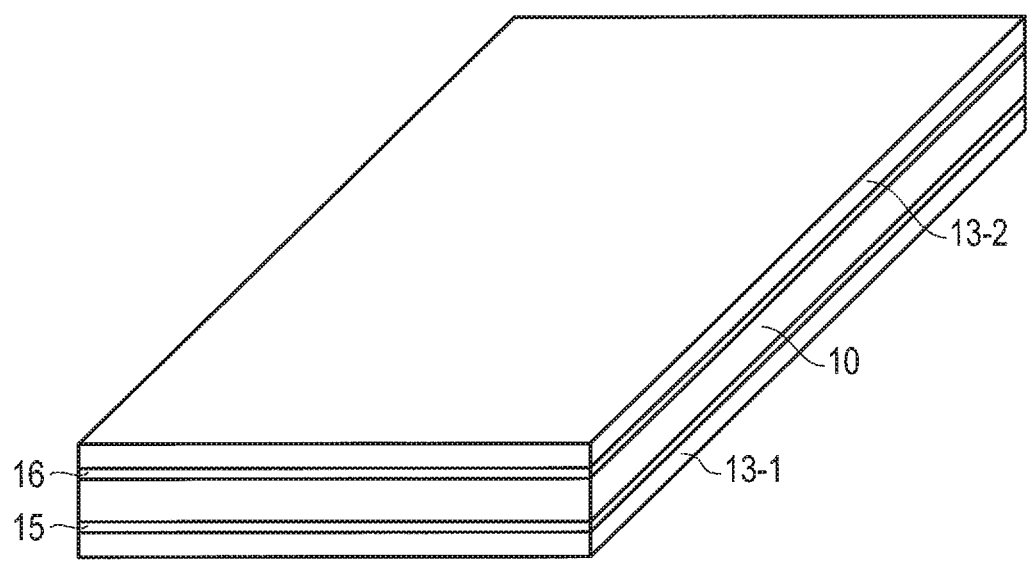
FIG. 11 is a perspective view showing a magnetic memory product according to a second modification of the first embodiment.
Figure 12:
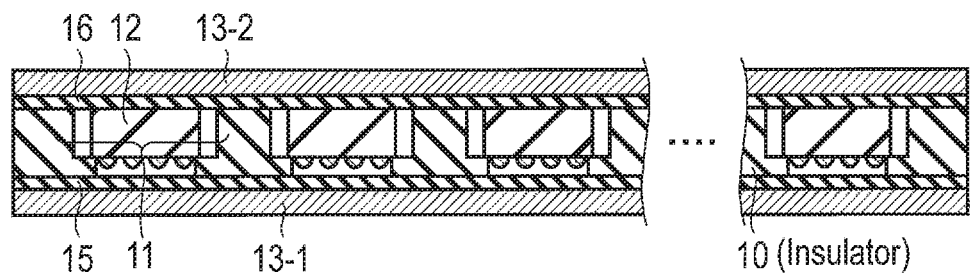
FIG. 12 and FIG. 13 are cross-sectional views of the magnetic memory product of FIG. 11.
Figure 13:
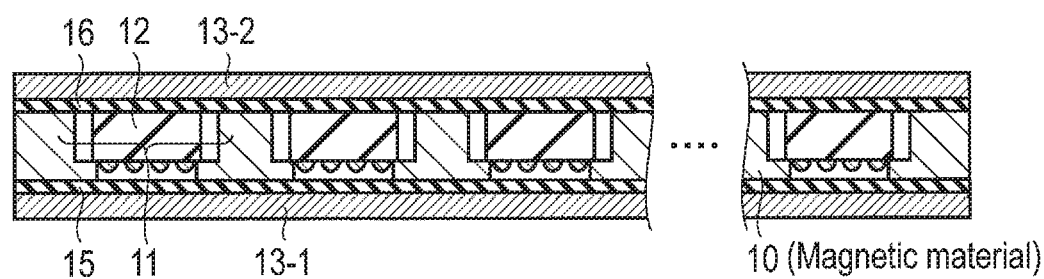

FIG. 11 shows a magnetic memory product according to a second modification of the first embodiment. FIG. 12 and FIG. 13 are cross-sections of the magnetic memory product of FIG. 11.

The second modification relates to a technique of protecting magnetic memories 12 in a tray 10 from static electricity in the first embodiment.

Two magnetic layers 13-1 and 13-2 are conductors. Accordingly, for example, when a user touches the two magnetic layers 13-1 and 13-2, static electricity may exert a bad influence on the magnetic memories 12. Thus, an insulating sheet 15 is disposed between the tray 10 and the magnetic layer 13-1, and an insulating sheet 16 is disposed between the tray 10 and the magnetic layer 13-2. However, instead of the insulating sheets 15 and 16, the surfaces of the two magnetic layers 13-1 and 13-2 may be coated with insulating layers.

In order that the positional relationship between the tray 10, the two magnetic layers 13-1 and 13-2, and the insulating sheets 15 and 16 will not vary from each other, these may be fixed by a band, an adhesive sheet, etc.

The other points are the same as in the first embodiment. Accordingly, the same elements as those explained in the first embodiment are given the same numbers, and thus, a detailed explanation thereof is omitted.

Third Modification of First Embodiment

Figure 14:
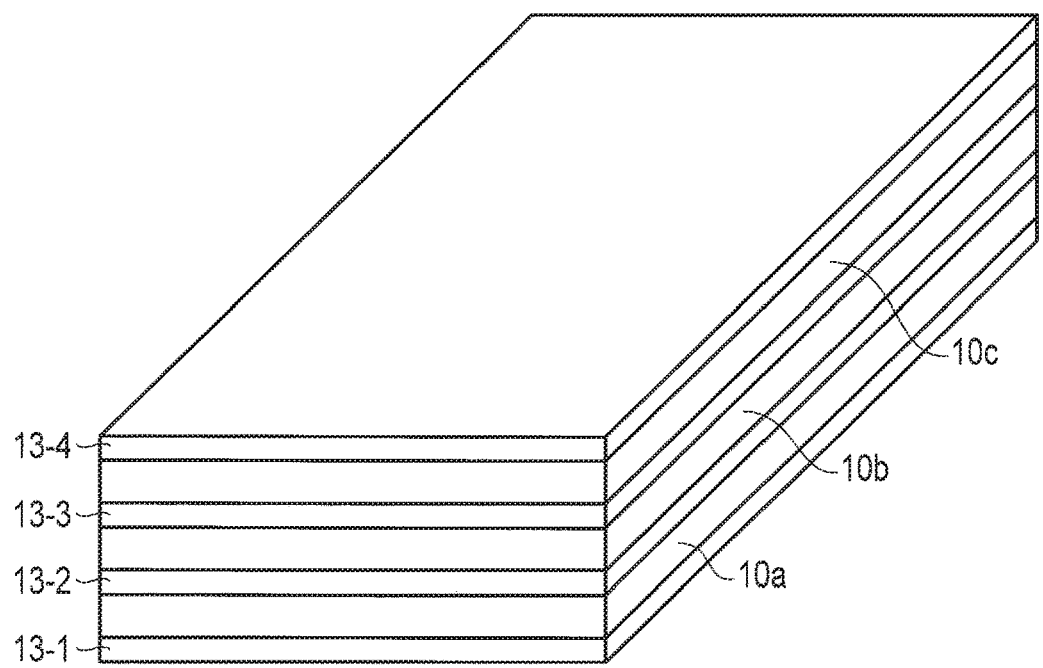
FIG. 14 is a perspective view showing a magnetic memory product according to a third modification of the first embodiment.
Figure 15:
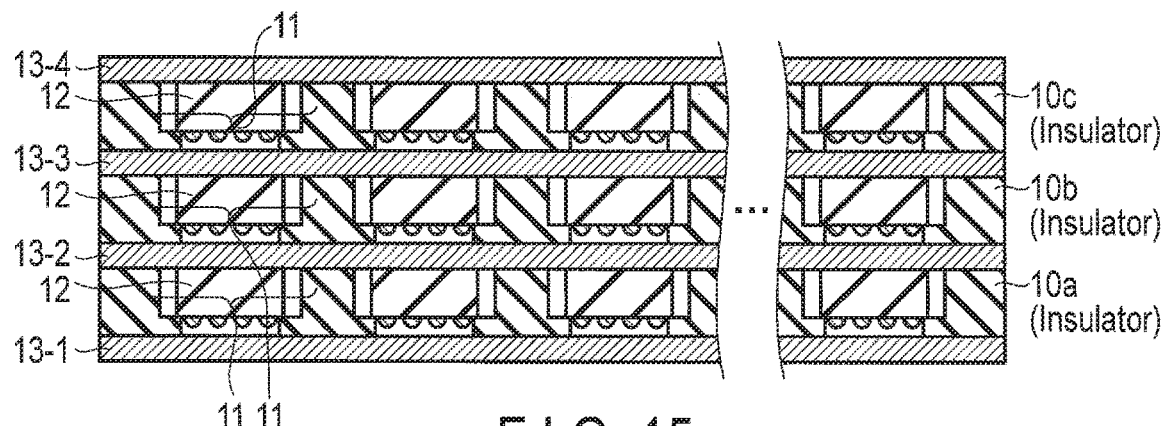
FIG. 15 and FIG. 16 are cross-sectional views of the magnetic memory product of FIG. 14.
Figure 16:
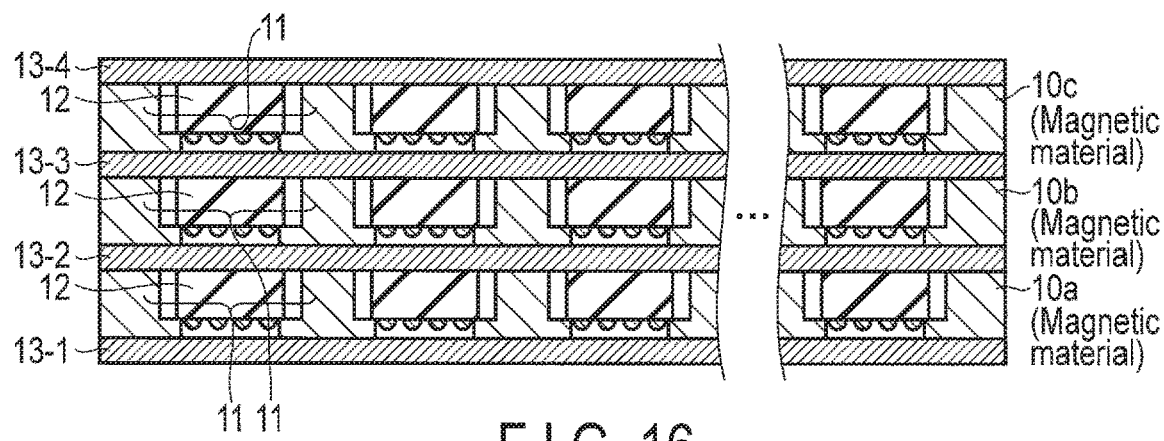

FIG. 14 shows a magnetic memory product according to a third modification of the first embodiment. FIG. 15 and FIG. 16 are cross-sections of the magnetic memory product of FIG. 14.

The third modification relates to a technique of stacking trays, thereby reducing the number of magnetic shielding layers (magnetic layers) per tray and restraining an increase in manufacturing cost in the first embodiment.

Trays (three trays in the present example) 10a, 10b, and 10c, and magnetic layers (four magnetic layers in the present example) 13-1, 13-2, 13-3, and 13-4 are stacked alternately. Each of the trays 10a, 10b, and 10c is the same as the tray 10 of the first embodiment, and each of the magnetic layers 13-1, 13-2, 13-3, and 13-4 is the same as the magnetic layers 13-1 and 13-2 of the first embodiment.

According to the present example, magnetic memories in n (n is a natural number greater than or equal to two) trays are shielded from an external magnetic field by (n+1) magnetic layers. This means that the number of magnetic shielding layers (magnetic layers) per tray is reduced, as compared to that in the case of shielding magnetic memories in one tray by two magnetic layers.

Accordingly, magnetic memories can be shielded from an external magnetic field without an increase in manufacturing cost.

In order that the positional relationship between the trays 10a, 10b, and 10c and the magnetic layers 13-1, 13-2, 13-3, and 13-4 will not vary all the time, they may be fixed by a band, an adhesive sheet, etc.

The other points are the same as in the first embodiment. Accordingly, the same elements as those explained in the first embodiment are given the same numbers, and thus, a detailed explanation thereof is omitted.

Others

The above-described four examples (the first embodiment and the first to third modifications thereof) can be combined with each other.

Second Embodiment

A second embodiment relates to a wrapper.

Figure 17:
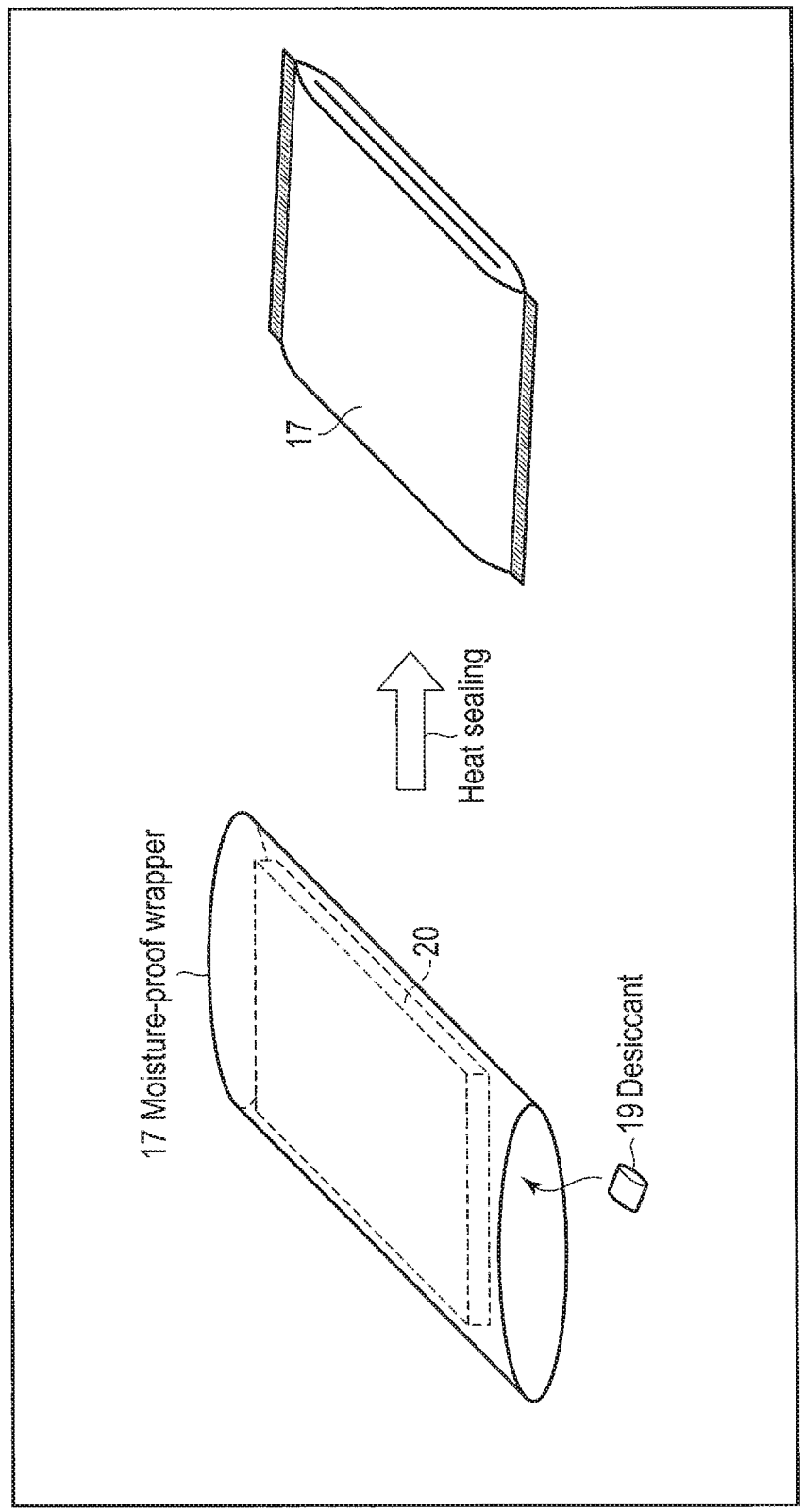
Figure 19:
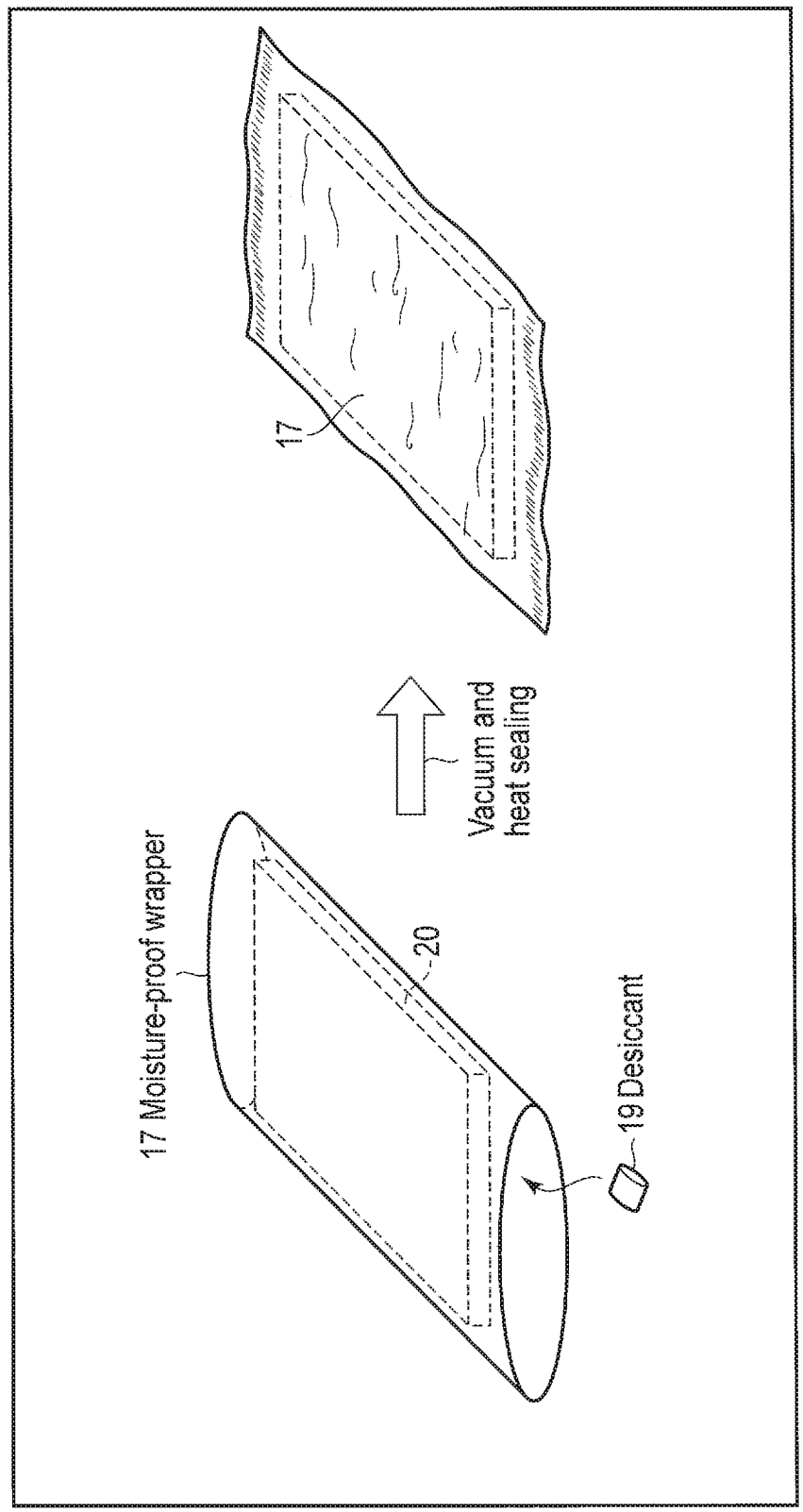
Figure 21:
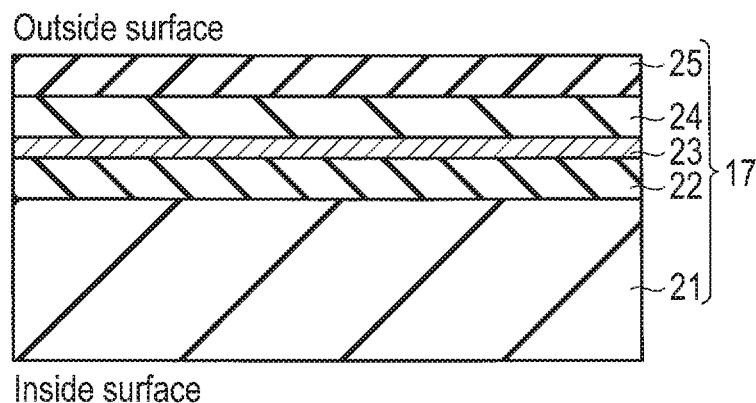
FIG. 21 is a cross-sectional view of a wrapper of FIG. 17 and FIG. 19.
Figure 22:
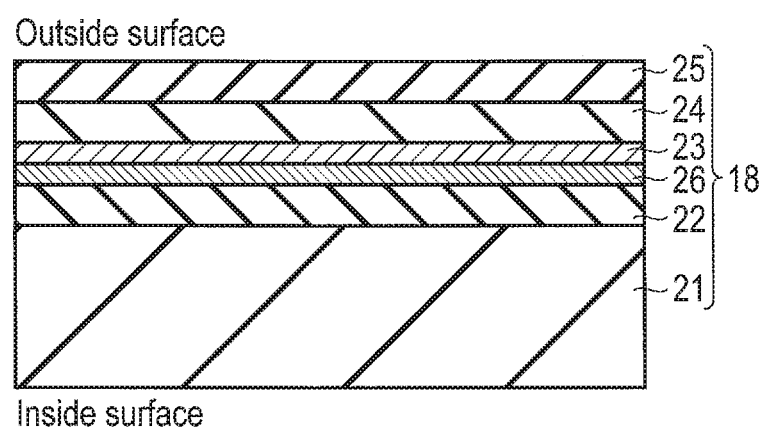
FIG. 22 is a cross-sectional view of a wrapper of FIG. 18 and FIG. 20.

FIG. 17 to FIG. 20 show a magnetic memory product according to the second embodiment. FIG. 21 is a cross-section of a wrapper of FIG. 17 and FIG. 19, and FIG. 22 is a cross-section of a wrapper of FIG. 18 and FIG. 20.

The wrapper of FIG. 17 and FIG. 19 protects magnetic memories 12 mounted in a tray 10 from moisture, static electricity, light, physical damage, etc.

For example, as shown in FIG. 21, a wrapper 17 comprises a laminate structure (main body) of an antistatic layer 21, a resin layer 22, a metal layer 23, a resin layer 24, and an insulating layer 25 from an inside surface to an outside surface.

The antistatic layer 21 comprises, for example, polyethylene, the resin layers 22 and 24 comprise, for example, a polyethylene resin, the metal layer 23 comprises, for example, aluminum, and the insulating layer 25 comprises, for example, nylon.

Here, the wrapper 17 has a sheet form at the beginning.

For example, as shown in FIG. 17 and FIG. 19, the wrapper 17 is sealed by heat sealing after being rolled into the shape of a cylinder to cover a magnetic memory product 20. At this time, vacuum sealing (FIG. 19) in which the air in the wrapper 17 is extracted may also be used. In addition, a desiccant 19 such as silica gel may be inserted into the wrapper 17.

It should be noted that the magnetic memory product 20 is a magnetic memory product having a magnetic shielding function according to the first embodiment.

The wrapper of FIG. 18 and FIG. 20 protects magnetic memories 12 mounted in a tray 10 from moisture, static electricity, light, physical damage, etc., and shields the magnetic memories 12 from an external magnetic field.

For example, as shown in FIG. 22, a wrapper 18 comprises a laminate structure (main body) of an antistatic layer 21, a resin layer 22, a magnetic shielding layer 26, a metal layer 23, a resin layer 24, and an insulating layer 25 from an inside surface to an outside surface.

The antistatic layer 21, the resin layers 22 and 24, the metal layer 23, and the insulating layer 25 are the same as in the example of FIG. 17 and FIG. 19. In addition, the magnetic shielding layer 26 comprises, for example, a magnetic material having high magnetic permeability and high saturation magnetization. A material example of the magnetic shielding layer 26 is the same as the material example of magnetic layers given in the first embodiment.

Here, the wrapper 18 also has a sheet form at the beginning.

For example, as shown in FIG. 18 and FIG. 20, the wrapper 18 is sealed by heat sealing after being rolled into the shape of a cylinder to cover a magnetic memory product 20. At this time, vacuum sealing (FIG. 20) in which the air in the wrapper 17 is extracted may also be used. In addition, a desiccant 19 such as silica gel may be inserted into the wrapper 18.

In the present example, the magnetic memory product 20 may be a magnetic memory product not having a magnetic shielding function as shown in FIG. 1 to FIG. 3, or may be a magnetic memory product having a magnetic shielding function according to the first embodiment.

As described above, according to the second embodiment, a magnetic memory product having a magnetic shielding function is covered by a wrapper, or a magnetic memory product is covered by a wrapper having a magnetic shielding function, whereby the reliability of magnetic memories can be secured from shipment to implementation.

Third Embodiment

A third embodiment relates to a magnetic shield box.

Figure 24:
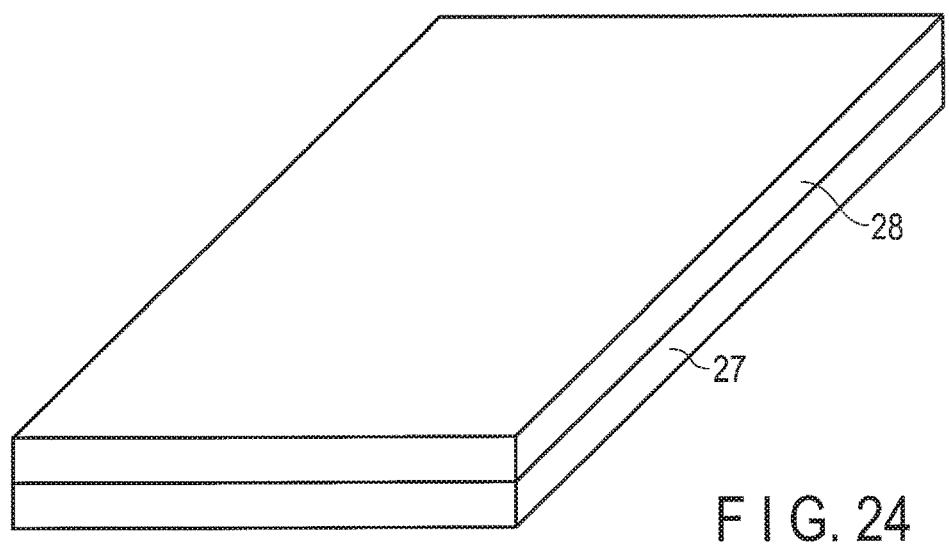
Figure 25:
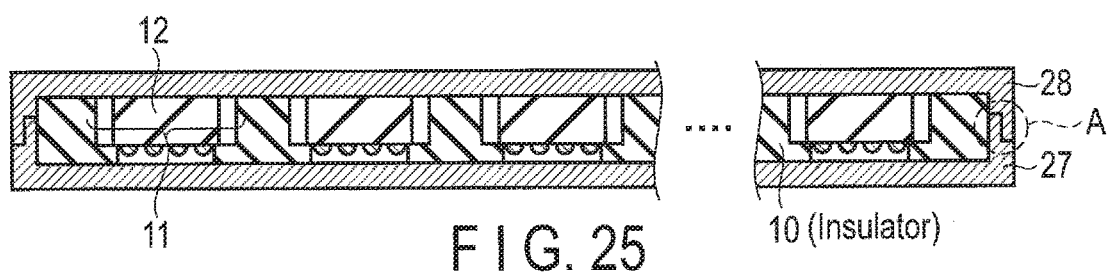
FIG. 25 is a cross-sectional view of the magnetic memory product of FIG. 24.

FIG. 23 and FIG. 24 show a magnetic memory product according to the third embodiment. FIG. 25 is a cross-section of the magnetic memory product of FIG. 24.

A tray 10 is a tray not having a magnetic shielding function described with reference to FIG. 1 to FIG. 3. The tray 10 includes a main body with a plate form, and mount portions 11 as holes disposed in the main body. Magnetic memories 12 are mounted in the mount portions 11, respectively.

Two magnetic layers 27 and 28 are a pair, and are combined together at a coupling portion A to form a magnetic shield box.

For example, the magnetic layer 27 comprises a depression. The tray 10 is mounted in the depression of the magnetic layer 27. In addition, the magnetic layer 28 also comprises a depression. The magnetic layer 28 functions as a lid covering the tray 10 mounted in the depression of the magnetic layer 27.

The two magnetic layers 27 and 28 each comprise a concave portion and a convex portion at the coupling portion A. The convex portions of the two magnetic layers 27 and 28 are fitted into the concave portions of the two magnetic layers 27 and 28, respectively, whereby the coupling between them is strengthened.

In addition, the two magnetic layers 27 and 28 may be further fixed by a band.

The magnetic layers 27 and 28 comprise, for example, a magnetic material having high magnetic permeability and high saturation magnetization. A material example of the magnetic layers 27 and 28 is the same as the material example of magnetic layers given in the first embodiment.

As described above, according to the third embodiment, a magnetic memory product is covered by a magnetic shield box, whereby the reliability of magnetic memories can be secured from shipment to implementation.

First Modification of Third Embodiment

Figure 26:
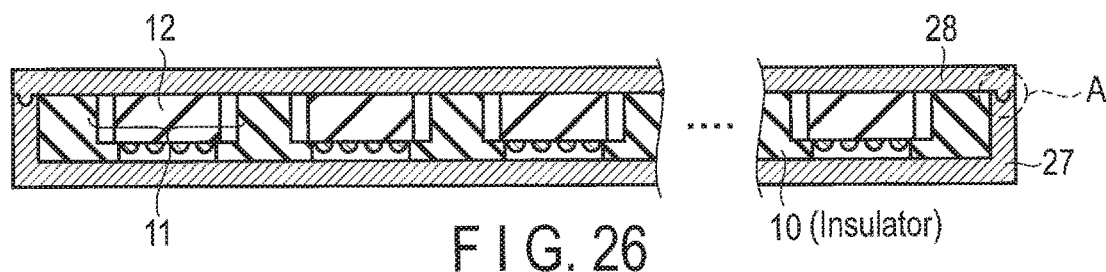
FIG. 26 is a cross-sectional view showing a magnetic memory product according to a first modification of the third embodiment.

FIG. 26 shows a magnetic memory product according to a first modification of the third embodiment.

In the first modification, the shapes of two magnetic layers 27 and 28 and a structure coupling them differ from those in the third embodiment (FIG. 25).

The magnetic layer 27 has a bucket form comprising a depression, and the magnetic layer 28 has a plate form. The tray 10 is disposed in the depression of the magnetic layer 27.

The magnetic layer 28 comprises a convex portion at a coupling portion A, and the magnetic layer 27 comprises a concave portion, at the coupling portion A, into which the convex portion of the magnetic layer 28 is fitted. However, the magnetic layer 27 may comprise a convex portion, while the magnetic layer 28 comprises a concave portion.

The other points are the same as in the third embodiment. Accordingly, the same elements as those explained in the third embodiment are given the same numbers, and thus, a detailed explanation thereof is omitted.

Second Modification of Third Embodiment

Figure 27:
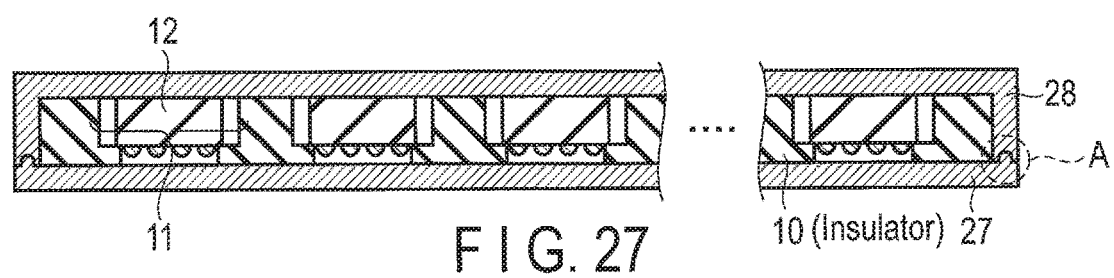
FIG. 27 is a cross-sectional view showing a magnetic memory product according to a second modification of the third embodiment.

FIG. 27 shows a magnetic memory product according to a second modification of the third embodiment.

The second modification is characterized by the shapes of two magnetic layers 27 and 28 and a structure coupling them as in the first modification.

The magnetic layer 27 has a plate form, and the magnetic layer 28 has a bucket form comprising a depression. In addition, a tray 10 is disposed on the magnetic layer 27. The magnetic layer 28 comprising the depression functions as a lid.

The magnetic layer 27 comprises a convex portion at a bong portion A, and the magnetic layer 28 comprises a concave portion, at the coupling portion A, into which the convex portion of the magnetic layer 27 is fitted. However, the magnetic layer 28 may comprise a convex portion, while the magnetic layer 27 comprises a concave portion.

The other points are the same as in the third embodiment. Accordingly, the same elements as those explained in the third embodiment are given the same numbers, and thus, a detailed explanation thereof is omitted.

Third Modification of Third Embodiment

Figure 28:
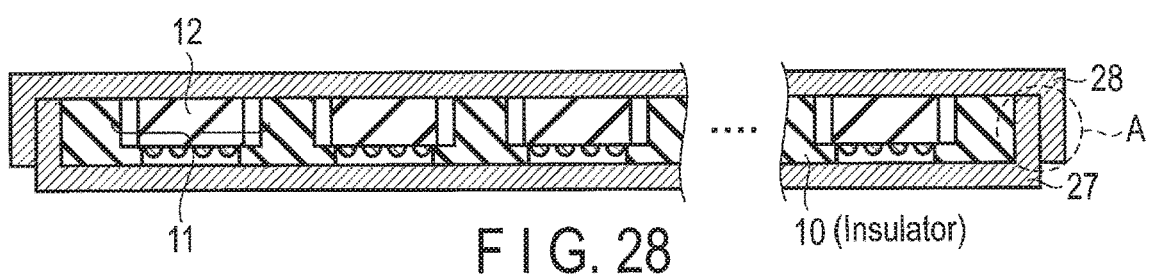
FIG. 28 is a cross-sectional view showing a magnetic memory product according to a third modification of the third embodiment.

FIG. 28 shows a magnetic memory product according to a third modification of the third embodiment.

In the third modification, the shapes of two magnetic layers 27 and 28 and a structure coupling them differ from those in the third embodiment (FIG. 25).

The two magnetic layers 27 and 28 have a bucket form comprising a depression as in the first embodiment. However, unlike those in the first embodiment, the size of the magnetic layer 28 is set to be one size larger than the size of the magnetic layer 27. Accordingly, the two magnetic layers 27 and 28 comprise portions overlapping each other at a coupling portion A.

The two magnetic layers 27 and 28 are thereby coupled to each other.

It should be noted that the size of the magnetic layer 27 may be one size larger than the size of the magnetic layer 28.

The other points are the same as in the third embodiment. Accordingly, the same elements as those explained in the third embodiment are given the same numbers, and thus, a detailed explanation thereof is omitted.

Fourth Modification of First Embodiment

Figure 29:
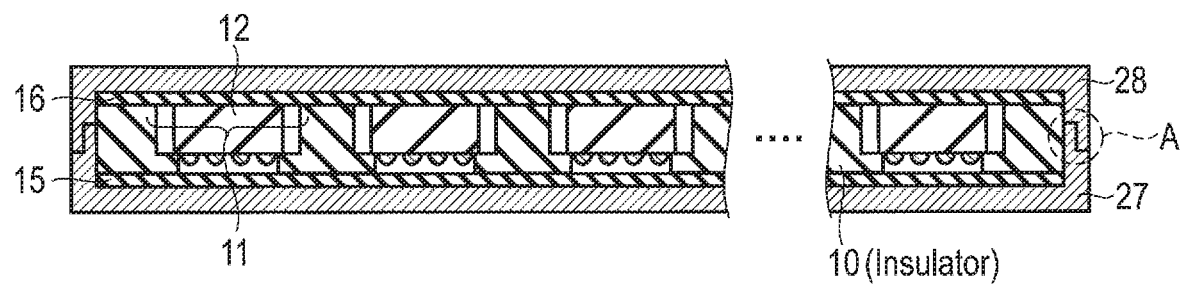
FIG. 29 is a cross-sectional view showing a magnetic memory product according to a fourth modification of the third embodiment.

FIG. 29 shows a magnetic memory product according to a fourth modification of the third embodiment.

The fourth modification relates to a technique of protecting magnetic memories 12 in a tray 10 from static electricity in the third embodiment.

Two magnetic layers 27 and 28 are conductors. Accordingly, for example, when a user touches the two magnetic layers 27 and 28, static electricity may exert a bad influence on the magnetic memories 12. Thus, an insulating sheet 15 is disposed between the tray 10 and the magnetic layer 27, and an insulating sheet 16 is disposed between the tray 10 and the magnetic layer 28. However, instead of the insulating sheets 15 and 16, the surfaces of the two magnetic layers 27 and 28 may be coated with insulating layers.

The other points are the same as in the third embodiment. Accordingly, the same elements as those explained in the third embodiment are given the same numbers, and thus, a detailed explanation thereof is omitted.

Fifth Modification of First Embodiment

Figure 30:
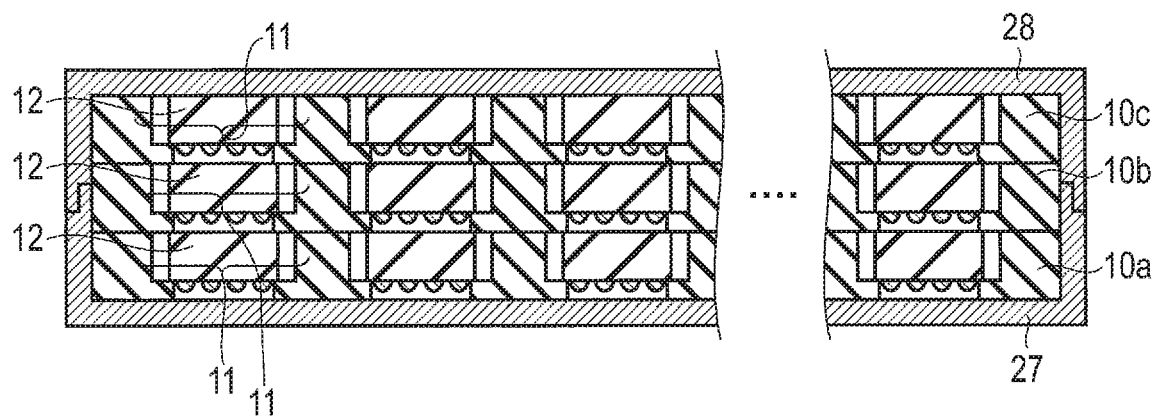
FIG. 30 is a cross-sectional view showing a magnetic memory product according to a fifth modification of the third embodiment.

FIG. 30 shows a magnetic memory product according to a fifth modification of the first embodiment.

The fifth modification relates to a technique of stacking trays, thereby increasing the number of magnetic memories shielded by one magnetic shield box and reducing a manufacturing cost in the third embodiment.

Trays (three trays in the present example) 10a, 10b, and 10c are disposed in a magnetic shield box in the state of being stacked on each other. Each of the trays 10a, 10b, and 10c is, for example, the same as the tray 10 described with reference to FIG. 1 to FIG. 3.

According to the present example, trays are accommodated in a magnetic shield box, whereby magnetic memories can be shielded from an external magnetic field without an increase in manufacturing cost.

The other points are the same as in the third embodiment. Accordingly, the same elements as those explained in the third embodiment are given the same numbers, and thus, a detailed explanation thereof is omitted.

Others

The above-described six examples (the third embodiment and the first to fifth modifications thereof) can be combined with each other.

Fourth Embodiment

A fourth embodiment relates to a wrapper in which the magnetic memory product according to the third embodiment is wrapped.

FIG. 31 and FIG. 32 show a magnetic memory product according to the fourth embodiment.

The magnetic memory product according to the third embodiment is extremely effective in shielding magnetic memories from an external magnetic field. However, the magnetic memory product only is sometimes insufficient in protecting magnetic memories from moisture, static electricity, etc.

Thus, the magnetic memory product according to the fourth embodiment comprises a wrapper 17 surrounding two magnetic memories 27 and 28 as a magnetic shield box. The wrapper 17 is the same as the wrapper (FIG. 21) not having a magnetic shielding function described in the second embodiment.

For example, the wrapper 17 is sealed by heat sealing after being rolled into the shape of a cylinder to cover the two magnetic layers 27 and 28. At this time, vacuum sealing (FIG. 32) in which the air in the wrapper 17 is extracted may also be used. In addition, a desiccant 19 such as silica gel may be inserted into the wrapper 17.

As described above, according to the fourth embodiment, a magnetic memory product having a magnetic shielding function is further covered by a wrapper having a moisture-proof function, an antistatic function, etc., whereby the reliability of magnetic memories can be secured from shipment to implementation.

Application Example

An application example in which magnetic memories are MRAMs in each of the above-described embodiments will be described.

Figure 33:
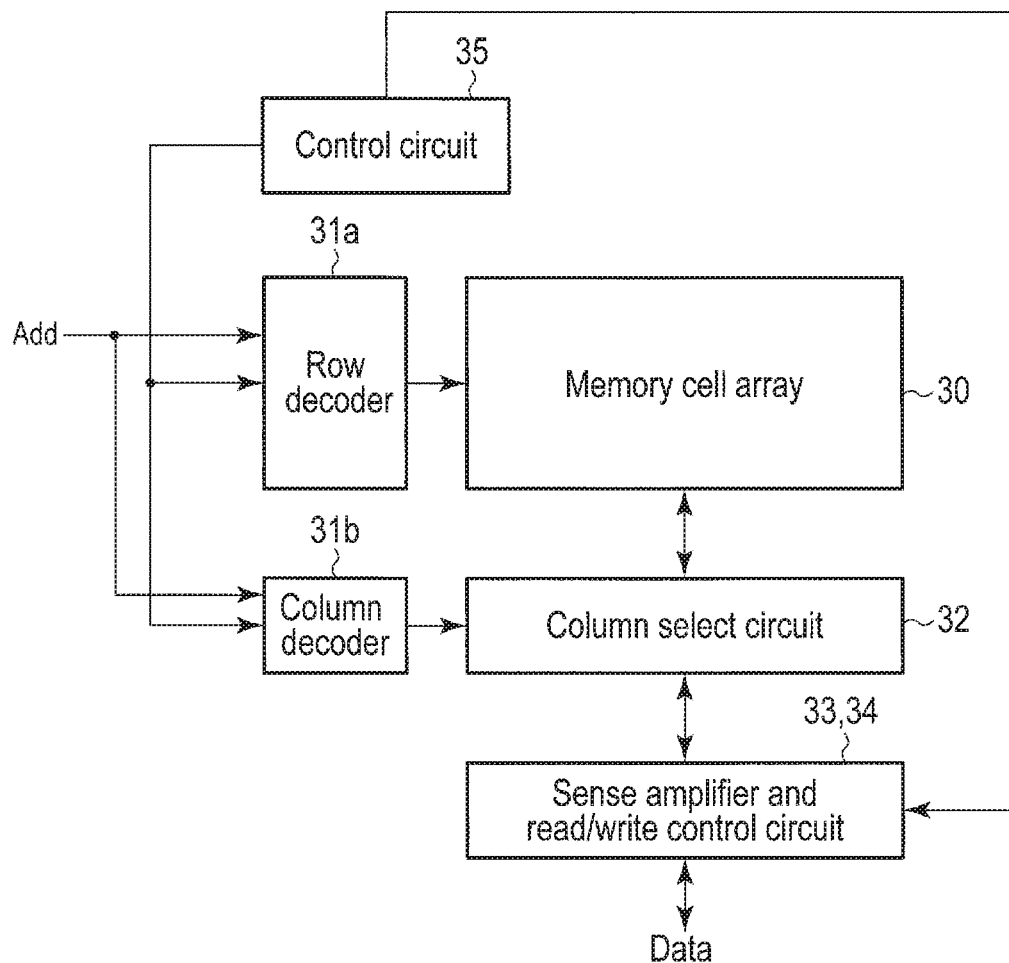
FIG. 33 is a diagram showing an MRAM as an application example.

FIG. 33 shows an MRAM.

A memory cell array 30 comprises memory cells. A row decoder 31a and a column decoder 31b randomly access one of the memory cells in the memory cell array 30 on the basis of an address signal Add.

A column select circuit 32 has a role of electrically connecting the memory cell array 30 and a sense amplifier 33 to each other on the basis of a signal from the column decoder 31b.

A read/write control circuit 34 supplies a read current to selected one memory cell in the memory cell array 30 at the time of reading. The sense amplifier 33 detects the read current, thereby determining data stored in the selected one memory cell.

In addition, the read/write control circuit 34 supplies a write current to selected one memory cell in the memory cell array 30 at the time of writing, thereby writing data to the selected one memory cell.

A control circuit 35 controls the operations of the row decoder 31a, the column decoder 31b, the sense amplifier 33, and the read/write control circuit 34.

Figure 34:
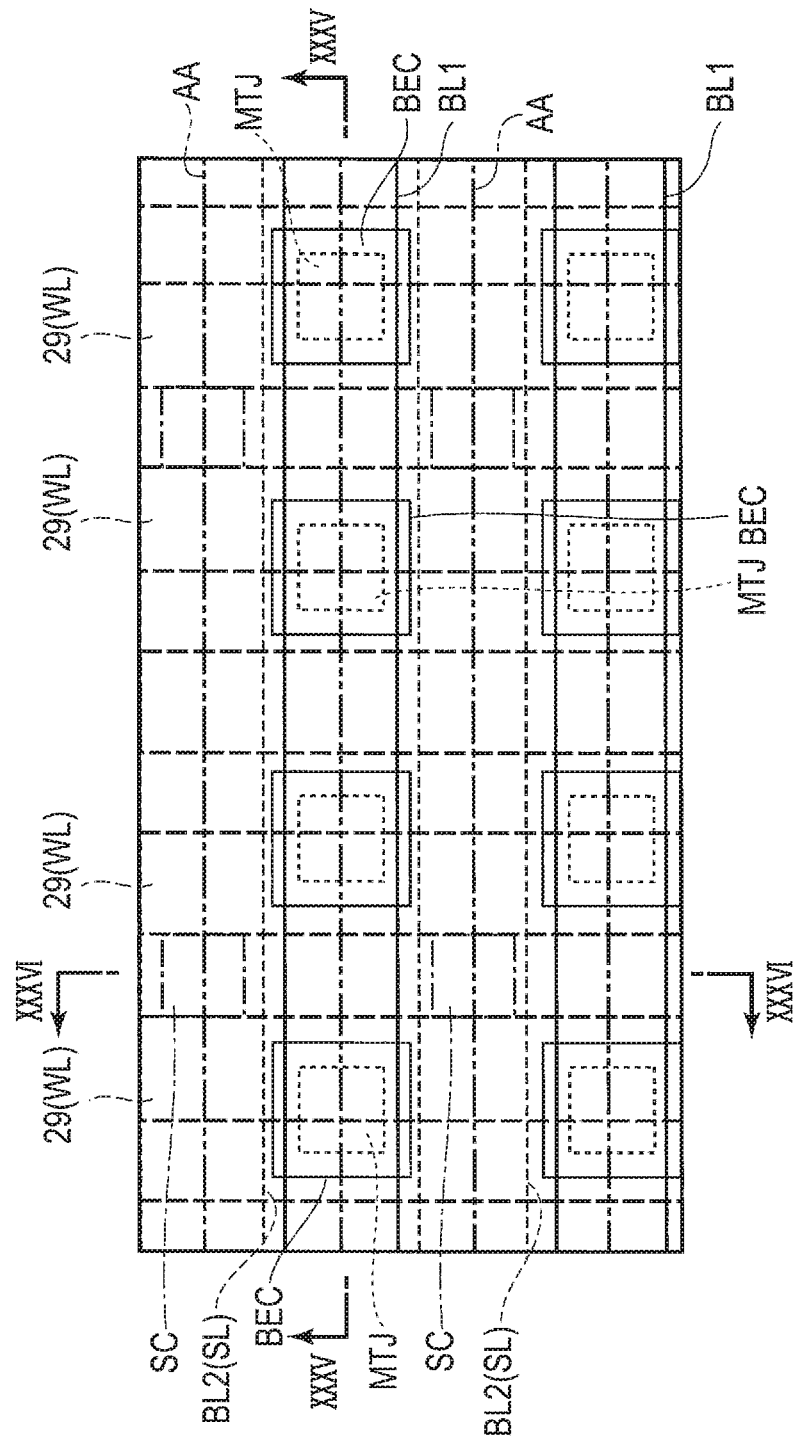
FIG. 34 is a diagram showing memory cells of the MRAM.
Figure 35:
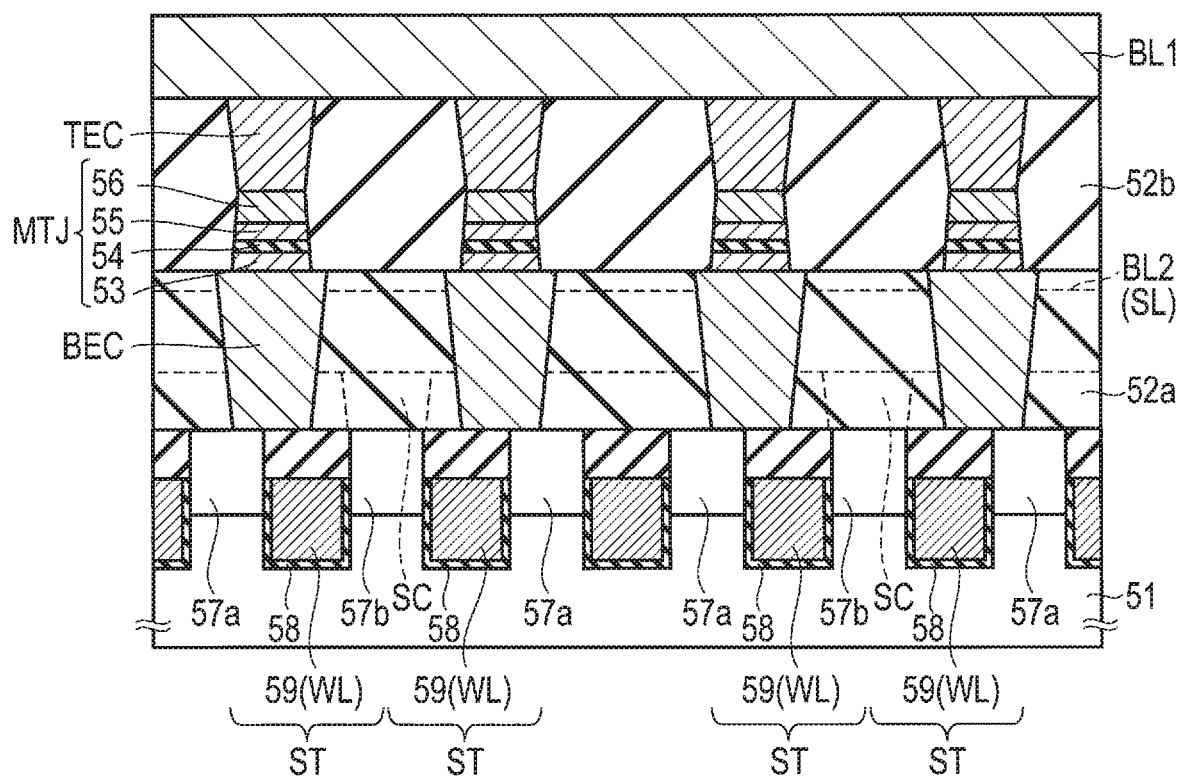
FIG. 35 is a cross-sectional view taken along line XXXV-XXXV of FIG. 34.
Figure 36:
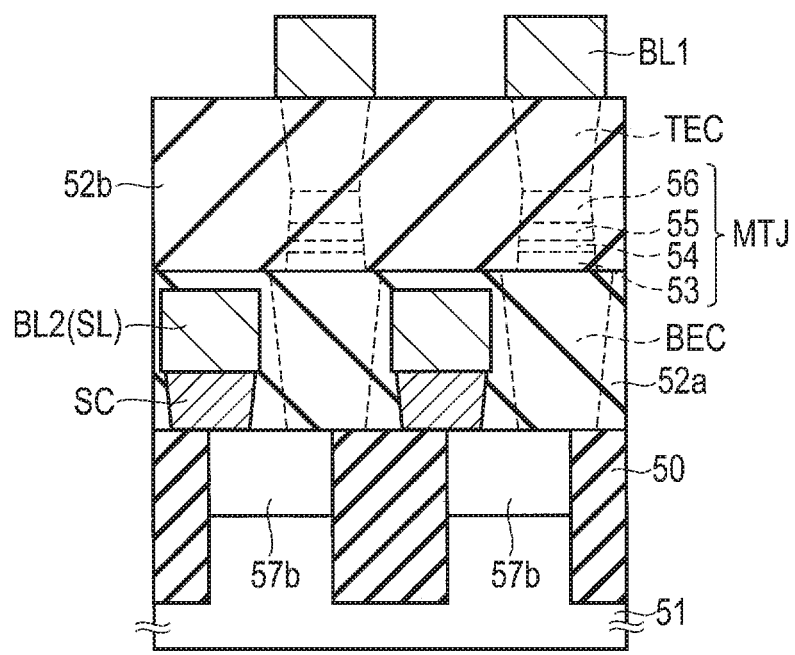
FIG. 36 is a cross-sectional view taken along line XXXVI-XXXVI of FIG. 34.

FIG. 34 to FIG. 36 show memory cells of the MRAM. FIG. 34 is a plan view of the memory cells of the MRAM, FIG. 35 is a cross-sectional view taken along line XXXV-XXXV of FIG. 34, and FIG. 36 is a cross-sectional view taken along line XXXVI-XXXVI of FIG. 34.

In the present example, the memory cells of the MRAM comprise a select transistor (for example, a FET) ST and a magnetoresistive effect element MTJ.

The select transistor ST is disposed in an active area AA in a semiconductor substrate 51. The active area AA is surrounded by an element isolation insulating layer 50 in the semiconductor substrate 51.

In the present example, the element isolation insulating layer 50 has a shallow trench isolation (STI) structure.

The select transistor ST comprises source/drain diffusion layers 57a and 57b in the semiconductor substrate 51, and a gate insulting layer 58 and a gate electrode (word line) 59 formed therebetween in the semiconductor substrate 51. The select transistor ST of the present example has a so-called buried-gate structure in which the gate electrode 59 is buried in the semiconductor substrate 51.

An interlayer insulating layer (for example, an oxide silicon layer) 52a covers the select transistor ST. Contact plugs BEC and SC are disposed in the interlayer insulating layer 52a. The contact plug BEC is connected to the source/drain diffusion layer 57a, and the contact plug SC is connected to the source/drain diffusion layer 57b. The contact plugs BEC and SC include, for example, one of W, Ta, Ru, Ti, TiN, and TaN.

The magnetoresistive effect element MTJ is disposed on the contact plug BEC. The magnetoresistive effect element MTJ comprises a storage layer 53, a nonmagnetic insulating layer 54, a reference layer 55, and a cap layer 56. The cap layer 56 includes, for example, one of Pt, W, Ta, and Ru.

The resistance of the magnetoresistive effect element MTJ varies depending on the relative directions of magnetization of the storage layer 53 and the reference layer 55 because of the magnetoresistive effect. For example, the resistance of the magnetoresistive effect element MTJ is low in a parallel state in which the directions of magnetization of the storage layer 53 and the reference layer 55 are the same, and high in an antiparallel state in which the directions of magnetization of the storage layer 53 and the reference layer 55 are reversed.

The storage layer 53 and the reference layer 55 comprise, for example, CoFeB, MgFeO, FeB, lamination of them, etc. In the case of the magnetoresistive elements having vertical magnetization, the storage layer 53 and the reference layer 55 should preferably comprise TbCoFe having a perpendicular magnetic anisotropy, an artificial lattice in which Co and Pt are stacked, FePt regularized by $L_{1o}$ or the like. In this case, CoFeB or FeB may be provided as interface layers between the storage layer 53 and the nonmagnetic insulating layer 54 and between the nonmagnetic insulating layer 54 and the reference layer 55.

For example, In both of the top pin type and the bottom pin type, it is preferable that the storage layer 53 includes CoFeB or FeB, and the reference layer 55 includes CoPt, CoNi, or CoPd.

The nonmagnetic insulating layer 54 comprises, for example, MgO or AlO. The nonmagnetic insulating layer 54 may be an oxide of Al, Si, Be, Mg, Ca, Sr, Ba, Sc, Y, La, Zr, Hf, etc. If MgO is used as the nonmagnetic insulating layer 54, its thickness is set at approximately 1 nm, because of restrictions on resistance.

A contact plug TEC is disposed on the magnetoresistive effect element MTJ. The contact plug TEC includes, for example, one of W, Ta, Ru, Ti, TiN, and TaN. An interlayer insulating layer (for example, an oxide silicon layer) 52b covers the magnetoresistive effect element MTJ.

A bit line BL1 is connected to the magnetoresistive effect element MTJ via the contact plug TEC. A bit line BL2 is connected to the source/drain diffusion layer 57b via the contact plug SC. The bit line BL2 also functions as, for example, a source line SL to which a ground potential is applied at the time of reading.

Figure 37:
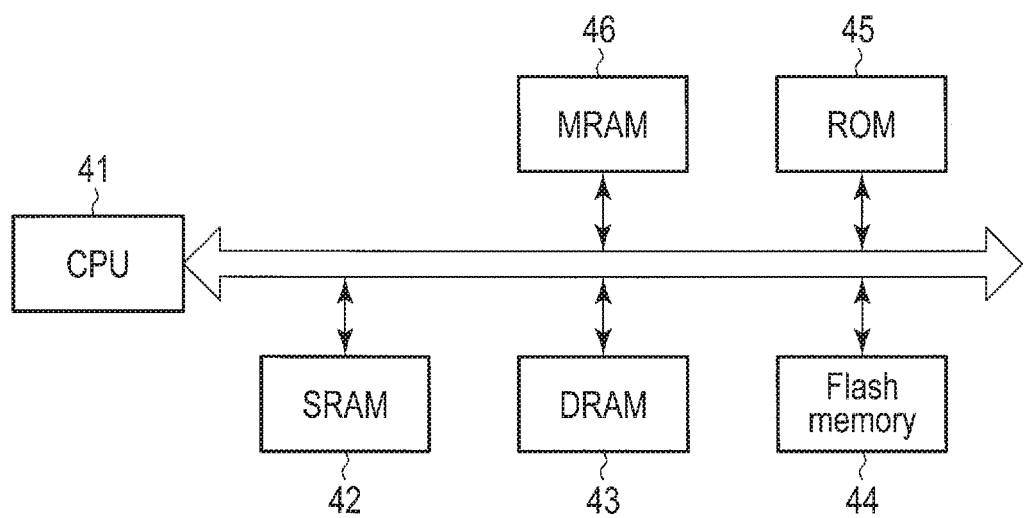
FIG. 37 is a diagram showing an example of a nonvolatile cache system.

FIG. 37 shows an example of a nonvolatile cache system.

The MRAM is used as a cache memory of a processor system, whereby the power consumption of the processor system can be reduced.

That is, the MRAM has characteristics of an unlimited number of times of rewriting, high-speed reading/writing, large capacity, etc. Accordingly, a processor system having low power consumption can be realized by replacing a volatile memory such as an SRAM and a DRAM generally used as a cache memory with the MRAM, which is a nonvolatile memory.

A CPU 41 controls an SRAM 42, a DRAM 43, a flash memory 44, a ROM 45, and an MRAM 46.

The MRAM 46 can be used as a replacement for the SRAM 42, the DRAM 43, the flash memory 44, and the ROM 45. Accordingly, at least one of the SRAM 42, the DRAM 43, the flash memory 44, and the ROM 45 may be omitted.

The MRAM 46 can be used as a nonvolatile cache memory (for example, an L2 cache).

CONCLUSION

As described above, according to the first to fourth embodiments, magnetic memories are effectively shielded from an external magnetic field without an increase in manufacturing cost, and the reliability of the magnetic memories can be secured from shipment to implementation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic shield tray comprising:
   a main body with a plate form including a magnetic material; and
   mount portions as holes disposed in the main body, the mount portions being configured such that magnetic memories are removably mountable thereto,
   wherein the magnetic material of the main body is disposed on an inner surface of the mount portions.

2. The tray of claim 1, wherein the holes pass through the main body.

3. The tray of claim 2, wherein each of the holes has a width which varies continuously.

4. The tray of claim 2, wherein each of the holes has a width which varies discontinuously.

5. A magnetic shield tray comprising:
a main body with a plate form including a resin and a magnetic material; and
mount portions as holes disposed in the main body, the mount portions being configured such that magnetic memories are removably mountable thereto,
wherein the magnetic material of the main body is disposed on an inner surface of the mount portions.

6. The tray of claim 5, wherein the holes pass through the main body.

7. The tray of claim 6, wherein each of the holes has a width which varies continuously.

8. The tray of claim 6, wherein each of the holes has a width which varies discontinuously.

9. A magnetic memory product comprising:
a tray including a main body with a plate form and mount portions as holes disposed in the main body, the mount portions being configured such that magnetic memories are removably mountable thereto; and
first and second magnetic layers which sandwich the tray and cover the magnetic memories.

10. The product of claim 9, wherein the main body includes a magnetic material.

11. The product of claim 9, wherein each of the first and second magnetic layers has a plate form.

12. The product of claim 11, wherein the first and second magnetic layers comprise convex portions, and the tray comprises concave portions into which the convex portions are fitted.

13. The product of claim 11, wherein the tray comprises convex portions, and the first and second magnetic layers comprise concave portions into which the convex portions are fitted.

14. The product of claim 9, further comprising:
a first insulating layer between the tray and the first magnetic layer; and
a second insulating layer between the tray and the second magnetic layer.

15. The product of claim 9, wherein the first and second magnetic layers are coupled to each other and have a box form.

16. The product of claim 15, wherein the first magnetic layer comprises a convex portion, and the second magnetic layer comprises a concave portion into which the convex portion is fitted.

17. The product of claim 15, further comprising:
a first insulating layer between the tray and the first magnetic layer; and
a second insulating layer between the tray and the second magnetic layer.

* * * * *